United States Patent
Holland et al.

(10) Patent No.: US 11,682,454 B2
(45) Date of Patent: *Jun. 20, 2023

(54) POSE ESTIMATION IN EXTENDED REALITY SYSTEMS

(71) Applicant: QUALCOMM Incorporated, San Diego, CA (US)

(72) Inventors: Wesley James Holland, Encinitas, CA (US); Mehrad Tavakoli, Cupertino, CA (US); Injoon Hong, San Diego, CA (US); Huang Huang, San Diego, CA (US); Simon Peter William Booth, San Diego, CA (US); Gerhard Reitmayr, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/518,485

(22) Filed: Nov. 3, 2021

(65) Prior Publication Data

US 2022/0059159 A1     Feb. 24, 2022

Related U.S. Application Data

(63) Continuation of application No. 16/667,754, filed on Oct. 29, 2019, now Pat. No. 11,232,834.

(51) Int. Cl.
*G06F 1/3287*     (2019.01)
*G06F 3/01*     (2006.01)
(Continued)

(52) U.S. Cl.
CPC .......... *G11C 11/419* (2013.01); *G06F 1/3287* (2013.01); *G06F 3/013* (2013.01);
(Continued)

(58) Field of Classification Search
CPC .......... G06F 1/3287; G06F 3/013; G06F 3/14; G06F 1/3293; G06F 3/011; G06F 3/012;
(Continued)

(56) References Cited

U.S. PATENT DOCUMENTS 8,939,584 B2    1/2015    Raffle et al.
9,513,974 B2    12/2016    Ito
(Continued)

FOREIGN PATENT DOCUMENTS

| EP | 2683204 A1 | 1/2014 |
|---|---|---|
| EP | 2770783 A2 | 8/2014 |
| EP | 2835717 A2 | 2/2015 |

OTHER PUBLICATIONS

International Search Report and Written Opinion—PCT/US2020/054488—ISA/EPO—dated Mar. 23, 2021.
(Continued)

*Primary Examiner* — Jeffery A Brier
(74) *Attorney, Agent, or Firm* — Qualcomm Incorporated

(57) ABSTRACT

Systems, methods, and computer-readable media are provided for providing pose estimation in extended reality systems. An example method can include tracking, in a lower-power processing mode using a set of lower-power circuit elements on an integrated circuit, a position and orientation of a computing device during a lower-power processing period, the set of lower-power circuit elements including a static random-access memory (SRAM); suspending, based on a triggering event, the tracking in the lower-power processing mode; initiating a higher-power processing mode for tracking the position and orientation of the computing device during a higher-power processing period; and tracking, in the higher-power processing mode using a set of higher-power circuit elements on the integrated circuit and a dynamic random-access memory
(Continued)

(DRAM), the position and orientation of the computing device during the higher-power processing period.

30 Claims, 10 Drawing Sheets

(51) Int. Cl.
  *G06F 3/14* (2006.01)
  *G06T 5/00* (2006.01)
  *G06T 19/00* (2011.01)
  *G11C 11/419* (2006.01)
  *G11C 11/412* (2006.01)
  *H10B 10/00* (2023.01)
(52) U.S. Cl.
  CPC ............... *G06F 3/14* (2013.01); *G06T 5/006* (2013.01); *G06T 19/006* (2013.01); *G11C 11/412* (2013.01); *H10B 10/12* (2023.02)
(58) Field of Classification Search
  CPC ........... G06T 5/006; G06T 19/06; G06T 7/70; G11C 11/419; G11C 11/412; H01L 27/1104; Y02D 10/00; Y02D 30/50; H10B 10/12
  See application file for complete search history.

(56) References Cited

U.S. PATENT DOCUMENTS

| | | | |
|---|---|---|---|
| 9,606,612 | B2 | 3/2017 | Milford |
| 9,851,787 | B2 | 12/2017 | Latta et al. |
| 11,232,834 | B2* | 1/2022 | Holland et al. ....... G11C 11/419 |
| 2011/0098029 | A1 | 4/2011 | Rhoads et al. |
| 2013/0295955 | A1 | 11/2013 | Sheshadri et al. |
| 2017/0303085 | A1 | 10/2017 | Kennedy et al. |
| 2018/0053284 | A1 | 2/2018 | Rodriguez et al. |
| 2018/0284802 | A1 | 10/2018 | Tsai et al. |
| 2021/0125664 | A1 | 4/2021 | Holland et al. |

OTHER PUBLICATIONS

Partial International Search Report—PCT/US2020/054488—ISA/EPO—dated Jan. 28, 2021.

* cited by examiner

| Fence Identifier | $X_{min}$ | $X_{max}$ | $Y_{min}$ | $Y_{max}$ | $Z_{min}$ | $Z_{max}$ | $Pitch_{min}$ | $Pitch_{max}$ | $Yaw_{min}$ | $Yaw_{max}$ | $Roll_{min}$ | $Roll_{max}$ |
|---|---|---|---|---|---|---|---|---|---|---|---|---|
| Fence 1 | 1 | 1.5 | 2 | 3 | -1 | 1 | 20° | 30° | any | any | any | any |
| ⋮ | ⋮ | ⋮ | ⋮ | ⋮ | ⋮ | ⋮ | ⋮ | ⋮ | ⋮ | ⋮ | ⋮ | ⋮ |
| Fence N | -0.5 | 0.5 | -1 | 1 | -1 | 1 | any | any | any | any | any | any |

FIG. 4A

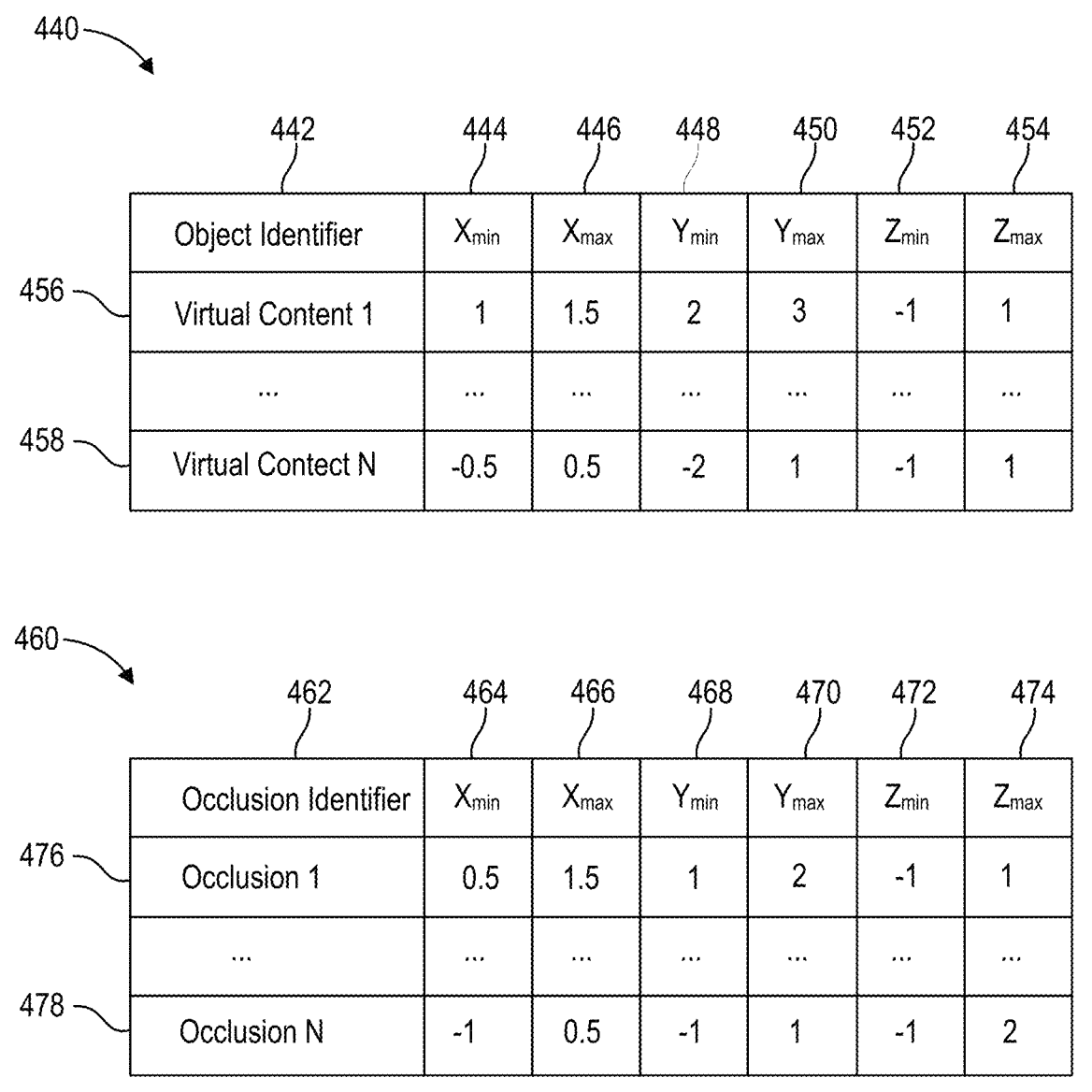

| Object Identifier | $X_{min}$ | $X_{max}$ | $Y_{min}$ | $Y_{max}$ | $Z_{min}$ | $Z_{max}$ |
|---|---|---|---|---|---|---|
| Virtual Content 1 | 1 | 1.5 | 2 | 3 | -1 | 1 |
| ... | ... | ... | ... | ... | ... | ... |
| Virtual Contect N | -0.5 | 0.5 | -2 | 1 | -1 | 1 |

| Occlusion Identifier | $X_{min}$ | $X_{max}$ | $Y_{min}$ | $Y_{max}$ | $Z_{min}$ | $Z_{max}$ |
|---|---|---|---|---|---|---|
| Occlusion 1 | 0.5 | 1.5 | 1 | 2 | -1 | 1 |
| ... | ... | ... | ... | ... | ... | ... |
| Occlusion N | -1 | 0.5 | -1 | 1 | -1 | 2 |

FIG. 4B

POSE ESTIMATION IN EXTENDED REALITY SYSTEMS

CROSS-REFERENCE TO RELATED APPLICATIONS

This application is a continuation of U.S. Non-Provisional application Ser. No. 16/667,754, filed Oct. 29, 2019, which is hereby incorporated by reference in its entirety and for all purposes.

TECHNICAL FIELD

The present disclosure generally relates to pose estimation technologies.

BACKGROUND

Pose estimation and tracking can be used in various applications, such as robotics, computer vision and extended reality (XR), to determine the position and orientation of a human or object relative to a scene or environment. This pose and tracking information can be used to manage interactions between a human or object and a specific scene or environment. For example, the pose (e.g., position and orientation) of a robot can be used to allow the robot to manipulate an object or avoid colliding with an object when moving about a scene. As another example, the pose of a device worn by a user can be used to enhance or augment the user's real or physical environment with virtual content.

BRIEF SUMMARY

Augmented reality (AR) seamlessly merges the real world with virtual objects to support realistic, intelligent, and personalized experiences. Virtual reality (VR) provides the ultimate level of immersion, creating a sense of physical presence in real or imagined worlds. Augmented virtuality (AV) seamlessly merges the virtual world with real world objects. Mixed reality (MR) merges the real world with the virtual world to produce new environments and visualizations where physical and digital objects can co-exist and interact with each other. Extended reality (XR) includes AR, AV, VR, and MR, and covers the full reality-virtuality continuum between the real and virtual environments.

In some examples, systems, methods, and computer-readable media are described for providing auxiliary pose estimation and tracking for power savings in tracking applications such as extended reality, robotic, and autonomous device applications. According to at least one example, a method is provided for implementing different circuit elements for pose estimation and tracking and auxiliary pose estimation and tracking to reduce power requirements. The method can include tracking, in a lower-power processing mode using a set of lower-power circuit elements on an integrated circuit, a position and orientation of a computing device during a lower-power processing period; initiating a higher-power processing mode for tracking the position and orientation of the computing device during a higher-power processing period; and tracking, in the higher-power processing mode using a set of higher-power circuit elements on the integrated circuit, the position and orientation of the computing device during the higher-power processing period, wherein the set of higher-power circuit elements track the position and orientation of the computing device using an element that is not included in the set of lower-power circuit elements or used by the set of lower-power circuit elements during the lower-power processing mode.

In another example, an apparatus is provided for implementing different circuit elements for pose estimation and tracking and auxiliary pose estimation and tracking to reduce power requirements. The apparatus can include an integrated circuit including a set of lower-power circuit elements configured to track, in a lower-power processing mode, a position and orientation of the apparatus during a lower-power processing period; and initiate a higher-power processing mode for tracking the position and orientation of the apparatus during a higher-power processing period. The integrated circuit can also include a set of higher-power circuit elements configured to track, in the higher-power processing mode, the position and orientation of the apparatus during the higher-power processing period, wherein the set of higher-power circuit elements track the position and orientation of the computing device using an element that is not included in the set of lower-power circuit elements or used by the set of lower-power circuit elements during the lower-power processing mode.

In another example, a non-transitory computer-readable medium is provided for implementing different circuit elements for pose estimation and tracking and auxiliary pose estimation and tracking to reduce power requirements. The non-transitory computer-readable medium can include a first set of instructions which, when executed by a set of lower-power circuit elements on an integrated circuit, cause the set of lower-power circuit elements to track, in a lower-power processing mode during a lower-power processing period, a position and orientation of a computing device; and initiate a higher-power processing mode for tracking the position and orientation of the computing device during a higher-power processing period. The non-transitory computer-readable medium can also include a second set of instructions which, when executed by a set of higher-power circuit elements on the integrated circuit, cause the set of higher-power circuit elements to track, in the higher-power processing mode, the position and orientation of the computing device during the higher-power processing period, wherein the set of higher-power circuit elements track the position and orientation of the computing device using an element that is not included in the set of lower-power circuit elements or used by the set of lower-power circuit elements during the lower-power processing mode.

In another example, an apparatus including means for implementing different circuit elements for pose estimation and tracking and auxiliary pose estimation and tracking to reduce power requirements is provided. The apparatus can include means for tracking, in a lower-power processing mode using a set of lower-power circuit elements on an integrated circuit, a position and orientation of a computing device during a lower-power processing period; initiating a higher-power processing mode for tracking the position and orientation of the computing device during a higher-power processing period; and tracking, in the higher-power processing mode using a set of higher-power circuit elements on the integrated circuit, the position and orientation of the computing device during the higher-power processing period, wherein the set of higher-power circuit elements track the position and orientation of the computing device using an element that is not included in the set of lower-power circuit elements or used by the set of lower-power circuit elements during the lower-power processing mode.

In some aspects, the set of higher-power circuit elements in the method, apparatuses, and non-transitory computer-readable medium described above can include a first processor and the set of lower-power circuit elements can include a second processor having a lower-power requirement than the first processor. In some examples, the first processor can include a central processing unit (CPU) and the second processor can include a digital signal processor (DSP). In some cases, the set of lower-power circuit elements can include a static random access memory (SRAM).

In some aspects, at least a portion of the set of higher-power circuit elements can be powered off during the lower-power processing period. In some examples, the integrated circuit can include a system-on-chip, and the element used by the set of higher-power circuit elements can include a dynamic random access memory (DRAM). Moreover, in some implementations, the DRAM can include an off-chip DRAM.

In some aspects, the set of higher-power circuit elements can include at least one of a central processing unit (CPU), a graphics processing unit (GPU), a digital signal processor (DSP), an image signal processor (ISP), and/or a phase-locked loop (PLL) clock generator, and the set of lower-power circuit elements can include at least one of a ring oscillator clock generator and a processor core.

In some aspects, the tracking in the lower-power processing mode can be based on sensor data received by the set of lower-power circuit elements from one or more inertial sensors and one or more image sensors, and the tracking in the higher-power processing mode can be based on sensor data received by the set of higher-power circuit elements from the one or more inertial sensors and the one or more image sensors. In some aspects, the tracking in the lower-power processing mode can be based on sensor data received by the set of lower-power circuit elements from one or more inertial sensors, and the tracking in the higher-power processing mode can be based on sensor data received by the set of higher-power circuit elements from the one or more inertial sensors and one or more image sensors.

In some aspects, the method, apparatuses, and non-transitory computer-readable medium described above can include generating, by the set of higher-power circuit elements, a feature map corresponding to a scene associated with the computing device, the feature map being generated by the set of higher-power circuit elements during the higher-power processing period and while operating in the higher-power processing mode, wherein the feature map includes a plurality of map points representing features at a three-dimensional location within the scene; and rendering, by the set of higher-power circuit elements during the higher-power processing period, virtual content on a display location corresponding to one or more features in the feature map, the virtual content being anchored to the one or more features in the feature map. In some aspects, the method, apparatus, and non-transitory computer-readable medium can include providing the feature map to the set of lower-power circuit elements.

In some examples, tracking the position and orientation of the computing device can include tracking a pose of the computing device relative to one or more features in the feature map, and the virtual content can include at least one of a virtual image, a virtual video, digital content, one or more virtual games, interactive virtual content, a virtual content overlay, a virtual scene, a virtual simulation, a virtual object, and/or a virtual web page.

In some aspects, the method, apparatuses, and non-transitory computer-readable medium described above can further include detecting that a content renderer associated with the set of higher-power circuit elements has not rendered the virtual content or additional virtual content for an amount of time; in response to detecting that the content renderer has not rendered the virtual content or additional virtual content for the amount of time, suspending the tracking in the higher-power processing mode; initiating the lower-power processing mode for tracking the position and orientation of the computing device during a second lower-power processing period; and tracking, in the lower-power processing mode using the set of lower-power circuit elements on the integrated circuit, the position and orientation of the computing device during the second lower-power processing period.

Moreover, in some aspects, the method, apparatuses, and non-transitory computer-readable medium described above can further include receiving, from one or more applications on the computing device, an indication that the one or more applications do not expect additional virtual content to be rendered for at least a period of time; suspending, based on the indication that the one or more applications do not expect additional virtual content to be rendered for at least the period of time, the tracking in the higher-power processing mode; initiating the lower-power processing mode for tracking the position and orientation of the computing device during a second lower-power processing period; and tracking, in the lower-power processing mode using the set of lower-power circuit elements on the integrated circuit, the position and orientation of the computing device during the second lower-power processing period.

In some aspects, the method, apparatuses, and non-transitory computer-readable medium described above can include detecting, by the set of higher-power circuit elements during the higher-power processing period, one or more lower-power processing triggering conditions; suspending, based on the one or more lower-power processing triggering conditions, the tracking in the higher-power processing mode; initiating the lower-power processing mode for tracking the position and orientation of the computing device during a second lower-power processing period; and tracking, in the lower-power processing mode using the set of lower-power circuit elements on the integrated circuit, the position and orientation of the computing device during the second lower-power processing period. In some examples, the one or more lower-power processing triggering conditions can include at least one of a determination that the computing device is located within a pre-mapped area, a determination that a rotational and translational motion of the computing device is below a threshold, and/or a determination that the computing device is outside a visible range associated with one or more virtual content items.

In some aspects, the method, apparatuses, and non-transitory computer-readable medium described above can include suspending, based on a triggering event, the tracking in the lower-power processing mode. In some examples, the triggering event can include at least one of a determination that in-state features in a feature map corresponding to a scene associated with the computing device are untrackable by the set of lower-power circuit elements from a current position and orientation of the computing device, a determination that an amount or speed of rotational and translational motion of the computing device exceeds a threshold, and/or a determination that a threshold amount of time has passed since the lower-power processing period and the lower-power processing mode were initiated. In other examples, the triggering event can include a determination that the computing device has breached a virtual content fence defining one or more computing device positions and a range of computing device orientations set to trigger the higher-power processing mode when the computing device is determined to be within the one or more computing device positions.

In some examples, the triggering event can include a determination that one or more virtual content objects are outside of a visible range from a current position and orientation of the computing device, and the determination that the one or more virtual content objects are outside of the visible range can be based on one or more respective locations of the one or more virtual content objects and a set of virtual content occlusion locations.

In some aspects, the apparatuses described above can include one or more sensors. In some examples, the apparatuses described above can include a mobile phone, a wearable device, a display device, a mobile computer, a head-mounted device, and/or a camera.

This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The foregoing, together with other features and embodiments, will become more apparent upon referring to the following specification, claims, and accompanying drawings.

BRIEF DESCRIPTION OF THE DRAWINGS

In order to describe the manner in which the above-recited and other advantages and features of the disclosure can be obtained, a more particular description of the principles described above will be rendered by reference to specific embodiments thereof which are illustrated in the appended drawings. Understanding that these drawings depict only example embodiments of the disclosure and are not to be considered to limit its scope, the principles herein are described and explained with additional specificity and detail through the use of the drawings in which:

FIG. 4A illustrates a table of example virtual content fences configured for triggering an escalation from a lower-power processing for pose estimation and tracking to a higher-power processing for pose estimation and tracking, in accordance with some examples of the present disclosure;

FIG. 4B illustrates tables of example virtual content fences defined based on location parameters of virtual objects and occlusion parameters associated with occlusions that may block a visibility of the virtual objects, in accordance with some examples of the present disclosure;

DETAILED DESCRIPTION

Figure 1:
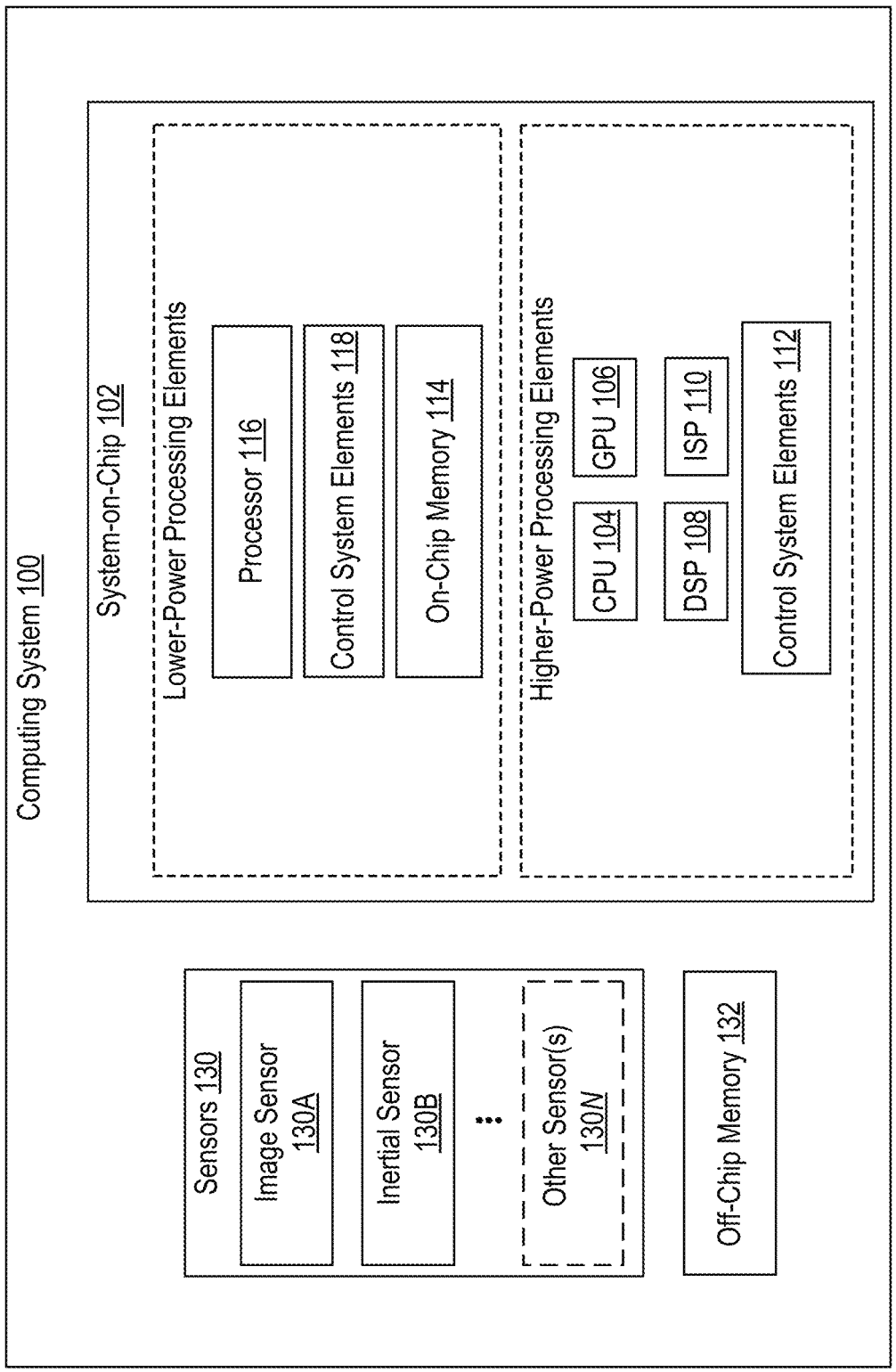
FIG. 1 illustrates an example architecture of a computing system for implementing lower-power and higher-power processing using different components for power savings, in accordance with some examples of the present disclosure.

Certain aspects and embodiments of this disclosure are provided below. Some of these aspects and embodiments may be applied independently and some of them may be applied in combination as would be apparent to those of skill in the art. In the following description, for the purposes of explanation, specific details are set forth in order to provide a thorough understanding of embodiments of the application. However, it will be apparent that various embodiments may be practiced without these specific details. The figures and description are not intended to be restrictive.

The ensuing description provides example embodiments only, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the application as set forth in the appended claims.

As noted above, the computational complexity of pose estimation, tracking, and extended reality operations can impose significant power and resource demands, which can be a limiting factor in various applications that rely on pose estimation, tracking, and extended reality operations. In many cases, the computational complexity and continuous use of pose estimation, visual and inertial tracking, and mapping operations can impose significant power and resource demands on devices. For example, in some implementations, such as AR implementations, pose estimation and tracking is set to run the entire time the AR device is in use, even when no virtual content is being displayed. This is because the AR device generally needs to have accurate or current pose and tracking information so it can render virtual content if the AR device moves to a new location or the orientation of the AR device changes, causing virtual content to become visible at the new location or orientation. The constant need for pose estimation and tracking results in high average power requirements for such AR devices, even when little or no virtual content is being displayed during use.

Such power and resource demands are exacerbated by recent trends towards implementing such technologies in mobile and wearable devices, and making such devices smaller, lighter and more comfortable (e.g., by reducing the heat emitted by the device) to wear by the user for longer periods of time. The high power and resource demands of pose estimation, tracking, and XR technologies can also adversely impact the battery life of such devices, particularly as users increasingly operate the devices for longer periods of time. Moreover, as these devices become smaller, adding further constraints to the battery technologies that can be implemented by such devices, the high power demands of such technologies and the longer periods of operation by users can become unsustainable.

The technologies herein can reduce the thermal and power requirements on hardware used in pose estimation, tracking, and extended reality applications, thus allowing such capabilities to be implemented in smaller, lighter, and more comfortable devices. In some examples, the technologies herein can address the foregoing power issues in tracking applications, such as XR and autonomous device applications, by implementing an integrated circuit with lower-power circuit elements for running lower-power operations, such as tracking operations, and higher-power circuit elements for running higher-power operations, such as higher fidelity tracking, mapping, and/or rendering operations. The integrated circuit can switch between lower-power operations, which can be executed by the lower-power circuit elements, and higher-power operations, which can be executed by the higher-power circuit elements. To conserve power, the higher-power circuit elements can be turned off while the lower-power circuit elements are running the lower-power operations. When the integrated circuit detects a trigger for waking up the higher-power circuit elements and running the higher-power operations, it can turn on the higher-power circuit elements and switch from the lower-power operations to the higher-power operations.

In some examples, the integrated circuit can implement an isolated, lower-power auxiliary processing region, which can be used along with the main or higher-power components in the integrated circuit to switch between lower and higher power processing to reduce a power usage of the integrated circuit. In these examples, the lower-power auxiliary processing region can perform lower-power operations, such as tracking, while the main or higher-power components can be powered on and used at other times when higher-power operations are to be performed, such as mapping, pose estimation, tracking, and rendering operations. The integrated circuit can switch at different times or events between the lower-power processing components and operations, and the main or higher-power components and operations, to provide power savings and support long usage times with smaller batteries. The lower-power auxiliary processing region can include circuit elements capable of performing tracking operations while other components in the integrated circuit, such as the main CPU (central processing unit), a DRAM (dynamic random-access memory) module(s), a GPU (graphics processing unit) and display component, are turned off.

For example, in some cases, the lower-power auxiliary processing region in the integrated circuit can implement a small kernel of operation or code that runs from on-chip hardware having lower power requirements, such as a smaller or lower-power processor core rather than the main CPU, and can use on-chip SRAM (static random-access memory) rather than DRAM, which typically has higher power requirements than SRAM. The smaller or lower-power processor core can use less power than the main CPU and the on-chip SRAM can similarly use less power than DRAM, thereby reducing the amount of power used by the lower-power auxiliary processing region. When the lower-power auxiliary processing region is in use, the remaining circuit elements in the integrated circuit, such as the CPU, GPU, display hardware, and other IP (intellectual property) cores, can be turned off to save power or otherwise used when such components are on and either active or inactive.

In some cases, the lower-power auxiliary processing region can provide additional power savings by using smaller line buffers and/or lower-power clock generation components or techniques. For example, instead of using power intensive phase-locked loops (PLLs) running from a crystal oscillator for clock generation, the lower-power auxiliary processing region can use ring oscillators for clock generation or for powering smaller PLLs with lower power requirements. Other example power saving techniques that can be implemented by the lower-power auxiliary processing region can include, without limitation, use of lower camera resolution and frame rates for lower-fidelity tracking during periods when no virtual content is rendered and/or use of lower power algorithms with lower-fidelity tracking during periods when no virtual content is rendered and/or periods when the acceptable pose confidence can be lowered.

The present technologies can be implemented to provide power savings in any tracking applications or use cases. For example, the present technologies can be implemented to provide power savings in robotic applications; extended reality applications, including 6 degrees of freedom (6 DoF) or 3 degrees of freedom (3 DOF) applications; game controllers; autonomous device applications such as self-driving vehicles; among other applications. In one non-limiting, illustrative example, the power saving techniques herein can be implemented in extended reality applications. The term extended reality (XR) can encompass augmented reality (AR), virtual reality (VR), mixed reality (MR), and the like. Each of these forms of XR allows users to experience or interact with immersive virtual environments or content.

To provide realistic XR experiences, XR technologies generally aim to integrate virtual content with the physical world. This typically involves generating a map of the real-world environment and tracking a pose relative to the map of the real-world in order to anchor content to the real-world in a convincing manner. The point of view or pose information can be used to match virtual content with the user's perceived motion and the spatio-temporal state of the real-world environment. The XR systems can support various amounts of motion, such as 6 degrees of freedom (6 DoF), which provides X, Y and Z (horizontal, vertical and depth) and pitch, yaw and roll; or 3 degrees of freedom (3 DOF), which provides X, Y and Z only.

However, the computational complexity of the visual and inertial tracking, mapping and rendering operations can impose significant power demands on XR systems. Such power demands are exacerbated by recent trends towards implementing XR technologies in smaller and lighter devices constrained by smaller batteries that typically have a reduced battery life, as well as devices that are designed to be more comfortable to wear on the user's head for longer periods of time (e.g., by reducing the heat emitted by the device). For example, wearable XR devices, such as head-mounted displays (HMDs), have a reduced amount of surface area available for dissipating heat and a lower power capacity than other, larger devices. These and other factors, which are improved by the technologies herein, can create significant challenges in designing and implementing lightweight and comfortable XR devices.

Figure 6:
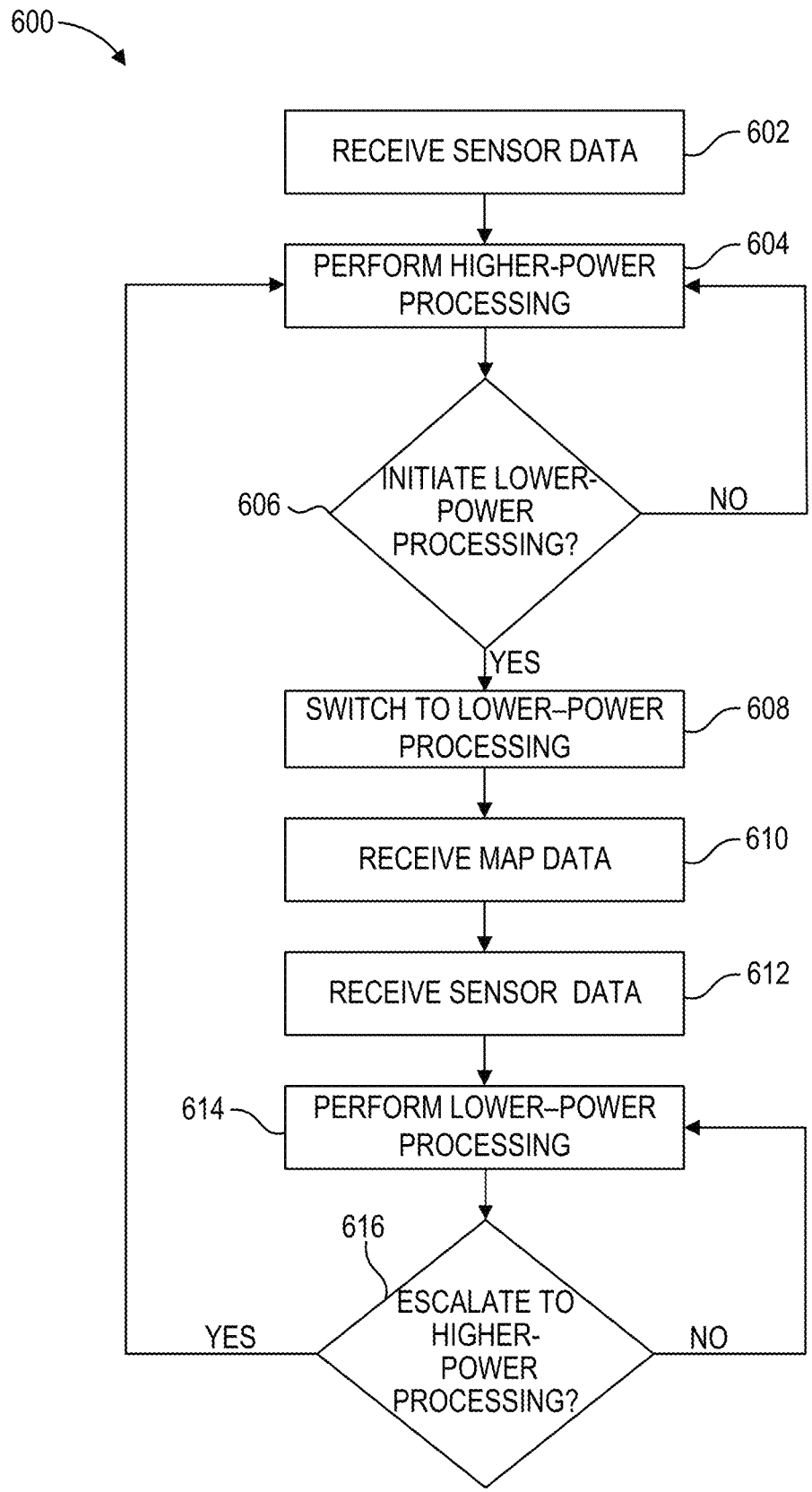
FIG. 6 illustrates an example flowchart for switching between higher-power processing for pose estimation and tracking and lower-power processing for pose estimation and tracking to achieve power savings, in accordance with some examples of the present disclosure.
Figure 7:
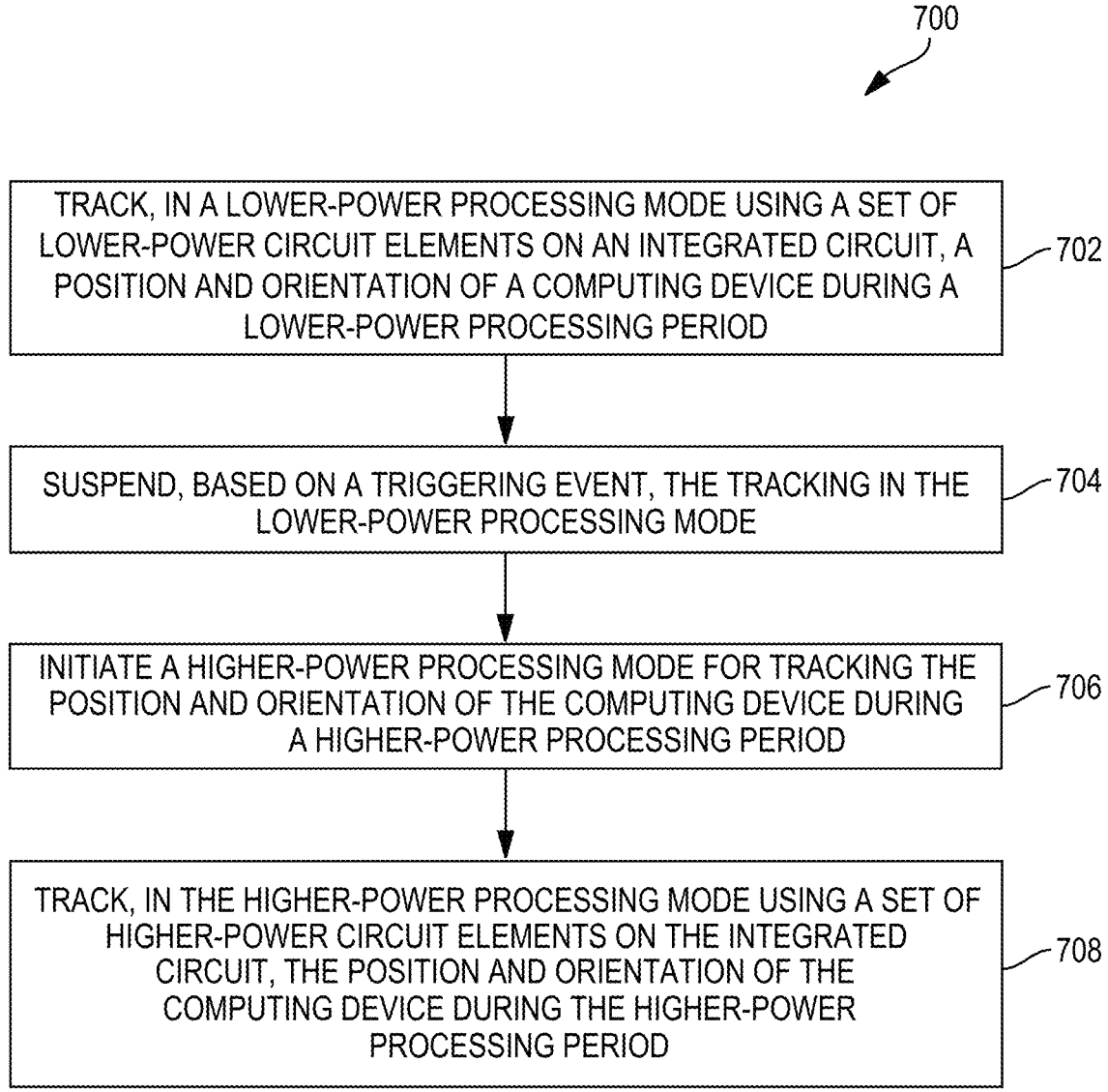
FIG. 7 illustrates an example method for implementing lower-power processing for pose estimation and tracking and higher-power processing for pose estimation and tracking, in accordance with some examples of the present disclosure.
Figure 8:
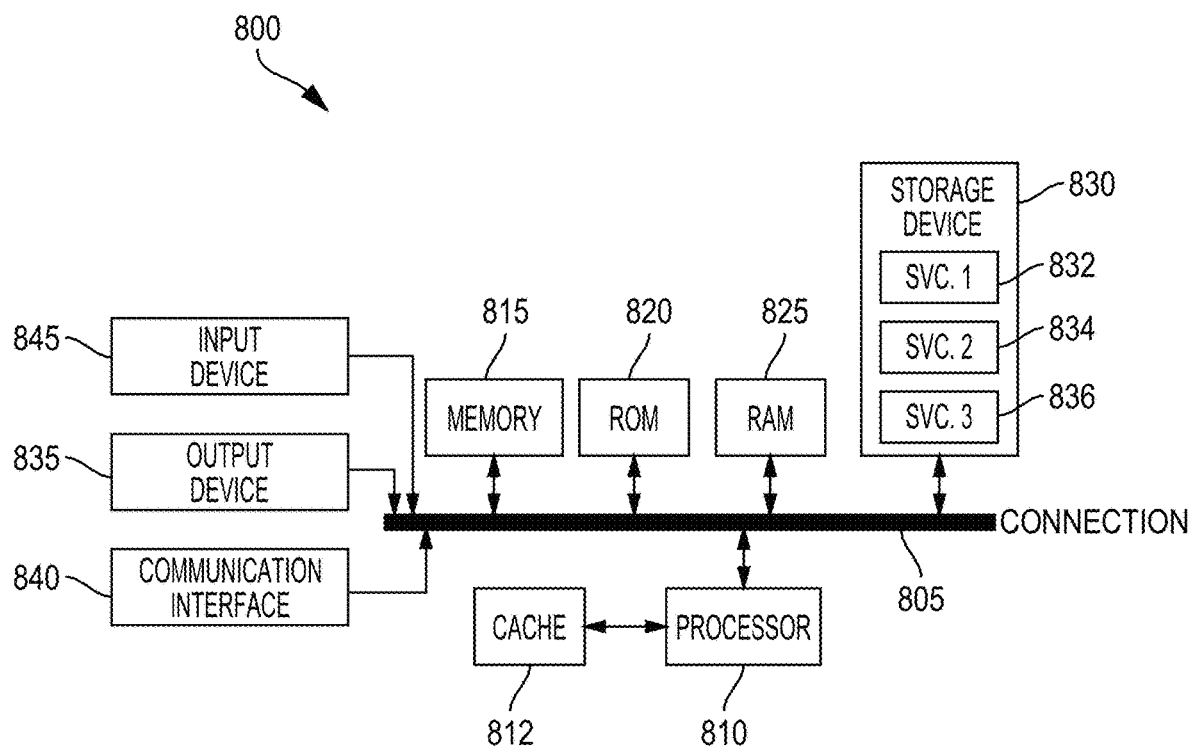
FIG. 8 illustrates an example computing device architecture, in accordance with some examples of the present disclosure.

The present technology will be described in the following disclosure. The discussion begins with a description of example systems, architectures, and techniques for providing auxiliary tracking and power savings in pose estimation and tracking applications, as illustrated in FIGS. 1 through 5. A description of example flows and methods for implementing higher-power processing for pose estimation and tracking and lower-power processing for power savings, as illustrated in FIGS. 6 and 7, will then follow. The discussion concludes with a description of an example computing device architecture including example hardware components suitable for performing tracking, mapping, and associated operations, as illustrated in FIG. 8. The disclosure now turns to FIG. 1.

FIG. 1 illustrates an example architecture of a computing system 100 for using different components to implement lower-power (e.g., auxiliary) and higher-power processing, such as lower-power pose estimation and tracking and higher-power pose estimation and tracking, for power savings. In some examples, the computing system 100 can be used to track an object (e.g., a user, a device associated with a user), map a scene, compute a 6 DoF (or any other) pose(s), render content, provide an XR (extended reality) experience, etc. Such operations (e.g., tracking, mapping, localization) can be implemented by the computing system 100 for a wide variety of applications such as robotic applications, gaming applications, XR applications, and autonomous device or vehicle applications. In one illustrative example, the computing system 100 can be implemented to provide XR experiences, such as 6DoF XR experiences, and power savings using lower-power pose estimation and tracking and higher-power visual inertial odometry (VIO) and/or pose estimation and tracking. As used herein, tracking can include tracking operations that use a persistent map for such tracking. Moreover, as used herein, VIO can include tracking operations that do not use a persistent map.

The computing system 100 can be implemented by one or more electronic devices. In some examples, the computing system 100 can include and/or can be implemented by an electronic device such as a mobile phone, a camera (e.g., a digital camera, an IP camera, a video camera, a camera phone, a video phone, or any suitable camera device), a laptop or notebook computer, a tablet computer, a display device, a video gaming device, a head-mounted display (HMD) device, a smart wearable device (e.g., smart glasses), a smart vehicle, a head-up display (HUD), an autonomous device, an Internet-of-Things (IoT) device, a game controller, or any other suitable electronic device. In other examples, the computing system 100 can be implemented by a combination of two or more electronic devices. Moreover, the computing system 100 can include and/or can be implemented using computer software, firmware, or any combination thereof, to perform the various operations described herein.

The computing system 100 can include or implement a system-on-chip (SoC) 102 with various circuit elements (e.g., 104-118), one or more sensors 130 for obtaining sensor measurements, and off-chip memory 132. The SoC 102 can include an integrated circuit configured to perform lower-power and higher-power operations, such as lower-power tracking operations and higher-power tracking or VIO operations, as further described herein. In some cases, the SoC 102 can perform tracking, mapping, localization and XR functionalities using data from the one or more sensors 130. In some examples, the SoC 102 can use some circuit elements (e.g., 104-112) and the off-chip memory 132 to perform higher-power tracking, mapping, localization and XR functionalities at certain periods of time; and other circuit elements (e.g., 114-118) to perform lower-power tracking at other periods of time. In this example, some or all of the circuit elements used to perform the higher-power tracking, mapping, localization, and XR functionalities can be powered off when the other circuit elements perform the lower-power tracking, in order to conserve power.

The circuit elements in the SoC 102 can include and/or can be implemented using electronic circuits or other electronic hardware, which can include, for example, a central processing unit (CPU) 104; a graphics processing unit (GPU) 106; a digital signal processor (DSP) 108; an image signal processor (ISP) 110; control system elements 112, such as phase-locked loop (PLL) circuits for clock generation; on-chip memory 114, such as on-chip static random-access memory (SRAM); a lower-power processor 116, such as a DSP core or a CPU core; and other control system elements 118, such as ring oscillators for clock generation. Moreover, in some examples, the SoC 102 can be assembled with at least some discrete components (e.g., CPU 104, GPU 106, DSP 108, ISP 110, control system elements 112, memory 114, lower-power processor 116, control system elements 118) that may not be on the same chip.

The SoC 102 can implement some of the circuit elements for higher-power processing and other circuit elements for lower-power processing to conserve power as described herein. For example, the SoC 102 can use higher-power processing elements (e.g., circuit elements with higher power consumption or requirements) for higher-power processing operations, and lower-power processing elements (e.g., circuit elements with lower power consumption or requirements) for lower-power processing operations. In this example, the higher-power processing elements can include the CPU 104, GPU 106, DSP 108, ISP 110, and control system elements 112, and the lower-power processing elements can include the lower-power processor 116, the other control system elements 118, and the on-chip memory 114. The higher-power processing elements can use the off-chip memory 132, which can be a higher-power memory such as DRAM (dynamic random-access memory), for running the higher-power operations, while the lower-power processing elements can use the on-chip memory 114, which can be a lower-power memory such as SRAM, for running the lower-power operations. By using the on-chip memory 114 during lower-power processing operations, as opposed to the off-chip memory 132 with the higher power consumption, the SoC 102 can conserve a significant amount of power.

Moreover, the higher-power processing elements (e.g., 104-112) can use the control system elements 112, which can include a higher-power clock generation circuits such as PLLs, for clock generation, while the lower-power processing elements (e.g., 114-118) can use the other control system elements 118, which can include lower-power clock generation circuits such as ring oscillators, for clock generation. In some cases, the control system elements 118 used by the lower-power processing elements (e.g., 114-118) for clock generation can include ring oscillators. In other cases, the control system elements 118 used by the lower-power processing elements (e.g., 114-118) for clock generation can also include smaller PLLs (e.g., smaller than PLLs associated with the control system elements 112 used by the higher-power processing elements) powered by ring oscillators.

To conserve power, the SoC 102 can switch at different times between higher-power processing operations, which can be implemented by the higher-power processing elements (e.g., 104-112), and lower-processing processing operations, which can be implemented by the lower-power processing elements (e.g., 114-118), as further described herein. When the SoC 102 runs the lower-power processing operations using the lower-power processing elements (e.g., 114-118), it can power off some or all of the higher-power processing elements (e.g., 104-112) in order to conserve power and prevent power leakage and idle power from the higher-power processing elements (e.g., 104-112). For example, when the SoC 102 runs the lower-power processing operations using the lower-power processing elements (e.g., 114-118), it can power off the CPU 104, GPU 106, DSP 108, ISP 110, control system elements 112, and/or any other circuit elements in the SoC 102 that are not used for the lower-power operations. Thus, the SoC 102 can obtain significant power savings by switching at times to lower-power processing operations and powering off those circuit elements used for higher-power operations, which have higher power consumption or requirements as previously explained, when running the lower-power processing operations.

In some cases, the SoC 102 can conserve power by using smaller line buffers and/or lower-power algorithms when performing the lower-power processing operations. For example, the SoC 102 can implement lower-power or lower-fidelity tracking algorithms when performing the lower-power processing operations. Moreover, in some examples, to further conserve power when implementing image data for lower-power tracking operations, the lower-power processing elements on the SoC 102 can utilize lower image resolution and frame rates than the higher-power processing elements on the SoC 102.

In some aspects, the SoC 102 can obtain sensor data from one or more of the sensors 130, and use the sensor data to perform various tasks for providing tracking and other XR functionalities such as mapping operations, localization operations, virtual content anchoring operations, virtual content generation operations, and rendering operations. The sensors 130 can include, for example, one or more image sensors 130A (e.g., camera sensors), one or more inertial sensors 130B (e.g., one or more inertial measuring units (IMUs), accelerometers, gyroscopes), and/or one or more other sensors 130N. The one or more other sensors 130N can include, for example and without limitation, one or more magnetometers, radars, light emitters (e.g., lasers), global positioning system (GPS) devices, altimeters, tilt sensors, motion detection sensors, light sensors, audio sensors, and Light Detection and Ranging (LIDAR) sensors. In some cases, one or more of the sensors 130 can be part of, or implemented by, the SoC 102. For example, in some cases, the SoC 102 can implement an image sensor (130A), an inertial sensor (130B), and/or any other sensor (130N).

The one or more image sensors 130A can capture image and/or video data. The one or more image sensors 130A can include, for example, one or more image and/or video capturing devices. The one or more inertial sensors 130B can be used to measure motion dynamics (e.g., speed, direction, acceleration, position, orientation) of a device (e.g., the computing system 100 and/or the SoC 102). In some cases, the one or more inertial sensors 130B can also be used to measure a magnetic field surrounding the device.

While the SoC 102 is shown to include certain components, one of ordinary skill will appreciate that the SoC 102 can include more or fewer components than those shown in FIG. 1. For example, in some instances, the SoC 102 can also include one or more other memory components (e.g., one or more caches, buffers, random access memories (RAMs), read only memories (ROMs), and/or the like), storage components, display components, processing components, circuits, controllers, sensors, interfaces, ASICs (application-specific integrated circuits), etc., that are not shown in FIG. 1. Moreover, while the computing system 100 is shown to include certain components, one of ordinary skill will appreciate that the computing system 100 can include more or fewer components than those shown in FIG. 1. For example, in some instances, the computing system 100 can include one or more wireless transceivers, one or more input devices (e.g., a touch screen, a keyboard, a mouse, an input sensor), one or more output devices (e.g., a display, a speaker, a projector), one or more storage devices, one or more other processing devices, etc., that are not shown in FIG. 1.

Figure 2:
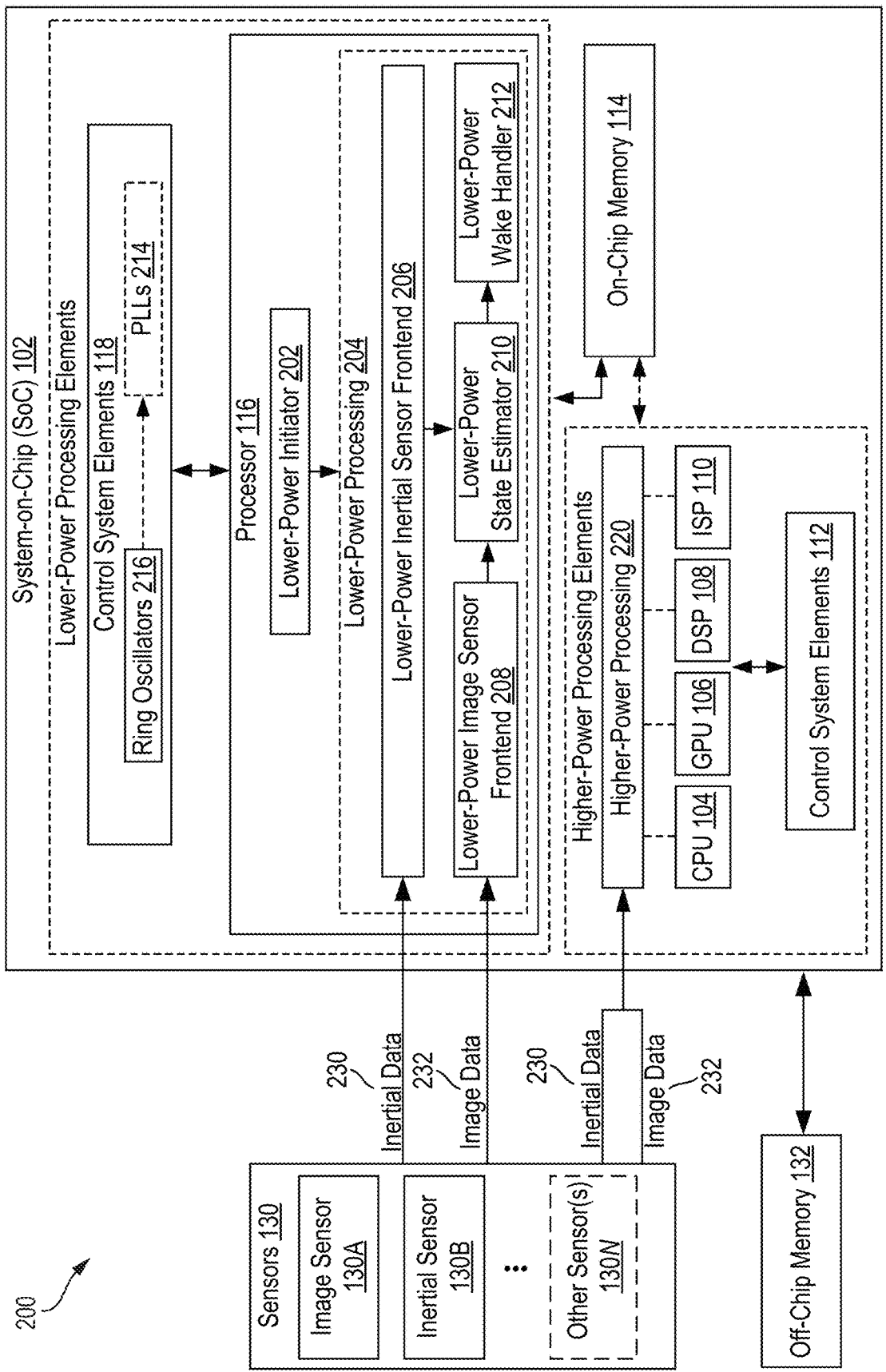
FIG. 2 is a diagram illustrating an example system configuration for implementing lower-power pose estimation and tracking and higher-power pose estimation and tracking using different circuit elements, in accordance with some examples of the present disclosure.

FIG. 2 is a diagram illustrating an example system configuration 200 for implementing lower-power (e.g., auxiliary) tracking and higher-power pose estimation and tracking using different circuit elements. In some cases, the higher-power pose estimation and tracking can include VIO operations and functionalities. Moreover, the lower-power tracking and higher-power pose estimation and tracking can be implemented by the different circuit elements, as described herein, to provide power savings. In this example, the system configuration 200 is provided in the context of the computing system 100 shown in FIG. 1.

The higher-power processing elements (e.g., 104-112) on the SoC 102 can use inertial data 230 from the inertial sensor 130B and image data 232 from the image sensor 130A to perform higher-power processing 220. The SoC 102 can use the CPU 104, the GPU 106, the DSP 108, and/or the ISP 110 to perform the higher-power processing 220. The higher-power processing elements (e.g., 104-112) on the SoC 102 can also use the off-chip memory 132 (e.g., DRAM) for the higher-power processing 220. The off-chip memory 132 can have higher performance capabilities and power requirements than the on-chip memory 114 (e.g., SRAM), and can thus enable higher processing performance while resulting in higher power consumption.

The higher-power processing 220 can provide higher-fidelity pose estimation and tracking, and can include, for example, 6DoF tracking, localization, mapping, VIO and/or XR operations (e.g., virtual content anchoring and rendering). As part of the higher-power processing 220, the higher-power processing elements can generate a map (e.g., a high-fidelity, visual feature map) of an environment or scene associated with the computing system 100 (e.g., the world around the computing system 100). The environment or scene can be, for example and without limitation, a room, a building, a stadium, a vehicle, an outdoor area, a store, a house, an office, a parking lot, a garage, a park, a facility, and a factory.

The map can chart, plot, model, or identify features, such as objects, space, and characteristics (e.g., shape, volume, size, position), of the mapped scene or environment. In some implementations, the map can be a two-dimensional (2D) or three-dimensional (3D) grid or model of the scene or environment and can include multiple map or feature points. Moreover, the map can include in-state features and/or out-of-state features. In-state features can include features that are visible from a current location of the computing system 100 and/or captured in one or more frames obtained from the image sensor 130A, and out-of-state features can include any other features in the map, such as features that are not visible from the current location of the computing system 100 and/or captured in the one or more frames obtained from the image sensor 130A.

The frames obtained from the image sensor 130A can include frames of a video sequence or still images. An image or frame can be a red-green-blue (RGB) image or frame having red, green, and blue color components per pixel; a luma, chroma-red, chroma-blue (YCbCr) image or frame having a luma component and two chroma (color) components (chroma-red and chroma-blue) per pixel; or any other suitable type of color or monochrome image or frame. Moreover, the images obtained from the image sensor 130A can provide a snapshot of the scene or environment associated with the computing system 100. Such images can be used in the higher-power processing 220 to track a pose associated with the computing system 100, track map features, generate or update the map or mapping data, correct or account for drift in the inertial sensor 130B, etc.

The lower-power processor 116 from the lower-power processing elements on the SoC 102 can also use at least part of the map to track mapped features when performing lower-power processing 204. To this end, the higher-power processing elements can transfer at least a portion of the map to the lower-power processor 116 for use in tracking mapped features. For example, when the lower-power initiator 202 initiates lower-power processing 204, the higher-power processing elements can stop the higher-power processing 220 and send at least a portion of a current map to the lower-power processor 116 for use in tracking a state and mapped features as described herein.

In some examples, the higher-power processing elements can transfer to the lower-power processor 116 a subset of the current map (e.g., a slice of the map, a subset of features or map points). The subset of the current map can include, for example, in-state features in the map. In some cases, the subset of the current map can also include a portion of out-of-state features estimated to be used by, or relevant to, the lower-power processor 116 in the near future (e.g., within a certain amount of time). The out-of-state features can be estimated to be in use or relevant in the near future based on a current pose of the computing system 100, a movement (e.g., velocity, direction or trajectory) of the computing system 100, and/or a proximity of the computing system 100 to such out-of-state features. In other examples, the higher-power processing elements can transfer to the lower-power processor 116 the entire map.

The lower-power processor 116 from the lower-power processing elements on the SoC 102 can implement the lower-power initiator 202 to determine when lower-power processing 204 can be initiated. In some examples, the lower-power initiator 202 can determine that lower-power processing 204 can be initiated if the higher-power processing elements are not performing mapping and/or rendering operations and the lower-power initiator 202 does not expect that mapping and/or virtual content rendering operations will be performed or needed for some time into the future. For example, to provide augmented reality (AR) functionality, the SoC 102 can continuously track a state (e.g., pose) of the computing system 100 to ensure that AR content is timely and accurately rendered (e.g., rendered at the correct time and location) and the AR experience is realistic. However, to save power at times when mapping and rendering operations, which generally have higher processing and power requirements, are not expected to be implemented, the SoC 102 can stop the higher-power processing 220, power off some or all of the higher-power processing elements, and switch to lower-power processing 204 implemented by the lower-power processing elements.

In some cases, the lower-power initiator 202 can determine that lower-power processing 204 can be initiated if the computing system 100 is determined to be in a pre-mapped area (e.g., a pre-mapped physical space), which can indicate that it is acceptable to use non-mapping tracking (e.g., tracking by determining a relative motion from image data 232 without temporarily constructing a complex three-dimensional map of the surrounding area), and/or if the rotational and translational motion of the computing system 100 is below a configurable threshold, which can indicate that a change in pose that will trigger a need to perform mapping or virtual content rendering operations is not likely to occur in the near future. The lower-power initiator 202 can determine whether the computing system 100 is in a pre-mapped area or the rotational and translational motion of the computing system 100 is below a configurable threshold based on, for example, sensor data (e.g., inertial data 230 and/or image data 232) from the sensors 130, which can be used to estimate a pose (e.g., position and orientation) of the computing system 100.

In some implementations, the lower-power initiator 202 can determine that lower-power processing 204 can be initiated if there is no anchored or configured virtual content visible (e.g., within a field of view (FOV) or being rendered) or likely to be visible in the near future. In some examples, the lower-power initiator 202 can determine that there is no virtual content visible or likely to be visible in the near future when the content renderer (e.g., the GPU 106) has not been used for a configurable amount of time. In other examples, the lower-power initiator 202 can implement a voting scheme in which each XR application on the computing system 100 votes on whether to allow lower-power processing 204 at a current time or in the near future. Each XR application can vote on whether to allow lower-power processing 204 based on whether the XR application expects associated virtual content to be rendered at a current time or in the near future (e.g., within a configured period of time).

In some examples, each XR application can determine if virtual content is expected to be rendered based on the location of any virtual content anchored or configured for use by that XR application and an estimated pose of the computing system 100. In some cases, a user can define different weights or priorities for different applications and/or votes from different applications. For example, a user can specify that votes from one XR application should be given a higher weight or priority than votes from another XR application. In other examples, a user can specify that votes from a specific XR application can be ignored or should confirmed by the user at all times, at specific times or during specific events/operations.

In some cases, the lower-power initiator 202 can disable lower-power processing 204 when positional audio is playing at the computing system 100. For example, since the tracking fidelity of the lower-power processing 204 may not be sufficiently high for positional audio, the lower-power initiator 202 may disallow lower-power processing 204 if audio is playing for additional power savings.

Moreover, in some AR use cases, the lower-power initiator 202 can enable lower-power processing 204 during head-locked rendering. For example, if the computing system 100 is only rendering head-locked layers, the tracking fidelity may be relaxed as if no virtual content is being rendered. Thus, the lower-power initiator 202 can optionally allow lower-power processing 204 during head-locked rendering.

Head-locked rendering can refer to scenarios where the computing system 100 is rendering one or more head-locked layers. A head-locked layer can be an overlay layer where the overlay layer (and/or virtual content associated with the overlay layer) is located in a persistent position relative to the computing system 100 and/or a display associated with the computing system 100 (e.g., a display configured to render virtual content from the computing system 100). By contrast, a layer that is not head-locked (e.g., a world-locked layer) can be an overlay layer that maintains its position with respect to the real world (e.g., where virtual content associated with the overlay layer moves relative to the display coordinates such as when the virtual content is anchored to a real world object).

Once the lower-power initiator 202 determines that lower-power processing 204 can be initiated, the SoC 102 can suspend the higher-power processing 220 performed by the higher-power processing elements (e.g., 104-112) on the SoC 102 and power off some or all of the higher-power processing elements (e.g., 104-112). The lower-power processor 116 can then initiate lower-power processing 204. During the lower-power processing 204, the lower-power processor 116 can track the pose of the computing system 100. The lower-power processor 116 can also use the map data obtained from the higher-power processing elements to track mapped features during the lower-power processing 204.

The lower-power inertial sensor frontend 206 can monitor inertial sensor 130B and obtain inertial data 230 from the inertial sensor 130B. The inertial data 230 can include location and/or orientation (e.g., roll, pitch, yaw) measurements. Moreover, the lower-power image sensor frontend 208 can monitor image sensor 130A and obtain image data 232 from the image sensor 130A. The lower-power state estimator 210 can obtain the inertial data 230 from the lower-power inertial sensor frontend 206 and/or the image data 232 from the lower-power image sensor frontend 208, and use the inertial data 230 and/or the image data 232 to track a pose of the computing system 100.

Using the inertial data 230 and/or the image data 232, the lower-power state estimator 210 can perform temporal filtering and sensor fusion to estimate the position and orientation of the computing system 100. In some examples, the lower-power state estimator 210 can process measurements or observations from the inertial data 230 and/or the image data 232 through one or more filters (e.g., one or more Kalman filters, one or more extended Kalman filters) that estimate a target's (e.g., the computing system 100) state (e.g., location, orientation, velocity, trajectory, acceleration, position, altitude) and error covariance. For example, the lower-power state estimator 210 can implement one or more filters, one or more motion models (e.g., one or more acceleration models, one or more angular rate models, one or more velocity models), and/or any other tracking algorithm(s) or model(s) to estimate a state of the computing system 100.

In one illustrative example, the lower-power state estimator 210 can process sensor data (e.g., 230, 232) using a Kalman filter or an extended Kalman filter (EKF) to estimate a state and error covariance for the computing system 100. The Kalman filtering process, also known as linear quadratic estimation (LQE), uses an algorithm that can apply a series of measurements observed over time, and produce estimates of unknown variables by estimating a joint probability distribution over the variables for each timeframe. In the EKF filtering process, the lower-power state estimator 210 can implement an EKF algorithm, which is the nonlinear version of the Kalman filter, that linearizes about an estimate of the current mean and covariance. The Kalman or EKF filter can include a prediction step and a measurement update step. The prediction step can use one or more models (e.g., an acceleration model, an angular rate model, a velocity model) for the target dynamics (e.g., position, orientation, trajectory, acceleration, velocity) to propagate or predict the target's states at some point in the future. Once the target's states have been propagated, a measurement can be applied to further increase the accuracy of the estimation.

As previously noted, the lower-power state estimator 210 can estimate, track, and/or predict a pose of the computing system 100. In some implementations, the pose of the computing system 100 can be correlated or associated with the pose of a user associated with the computing system 100. For example, in some cases, the computing system 100 can be a smart wearable device (e.g., HMD, smart glasses) worn by a user. When the smart wearable device is worn by the user, the pose of the smart wearable device can move in synchrony with a user's pose, and thus can be correlated or associated with the user's pose. However, in other implementations, a user may have a different or separate pose relative to the computing system 100. For example, a head-up display (HUD) in a vehicle can have a different or separate pose relative to a user in the vehicle.

Moreover, when performing sensor fusion, the lower-power state estimator 210 can fuse data from multiple sensors (e.g., 130). For example, the lower-power state estimator 210 can fuse inertial data (230) and/or image data (232) from multiple sensors. The multiple sensors (130) can include, for example, one or more image sensors (130A), one or more inertial sensors (130B).

The lower-power wake handler 212 can determine when lower-power processing 204 should be suspended and higher-power processing 220 should be initiated or resumed. To this end, the lower-power wake handler 212 can monitor and recognize pre-programmed tracking events and wake parameters (e.g., triggers or conditions) for initiating or resuming the higher-power processing 220. The lower-power wake handler 212 can receive state information (e.g., pose information) calculated by the lower-power state estimator 210 to determine whether to suspend lower-power processing 204 and initiate or resume higher-power processing 220.

In some examples, the wake parameters can include one or more virtual content fences specifying pose parameters (e.g., one or more poses, one or more ranges of poses.) and/or virtual content parameters (e.g., one or more virtual content locations, one or more virtual content occlusions) for triggering the higher-power processing 220. For example, the wake parameters can specify one or more virtual content fences configured to trigger the higher-power processing 220 to be initiated or resumed if a pose of the computing system 100 matches or falls within location and/or orientation parameters in the one or more virtual content fences, or alternatively if the pose of the computing system 100 does not match or fall within location and/or orientation parameters in the one or more virtual content fences.

In some examples, the one or more virtual content fences can be automatically harvested from a renderer (e.g., GPU 106) on the computing system 100. For example, the GPU 106 on the computing system 100 can know what content, if any, is being rendered. The GPU 106 can maintain an updated list of virtual content fences that take into account the location and state of any virtual content configured for rendering. The updated list of virtual content fences can thus be used to determine if virtual content is being rendered or likely to be rendered in the near future, which can be used to trigger the higher-power processing 220 to be initiated or resumed to render such virtual content or in anticipation of such virtual content being rendered. To illustrate, the higher-power processing 220 can be initiated or resumed when the computing system 100 is at, or within a proximity of, a location (or range of locations) specified in a virtual content fence, which can correspond to the location of virtual content, or when the computing system 100 has an orientation that matches an orientation (or is within a range of orientations) specified in a virtual content fence, which can correspond to an orientation from which virtual content is visible or rendered.

In other examples, the one or more virtual content fences can be obtained from one or more XR applications on the computing system 100. For example, each XR application on the computing system 100 can know the location of any virtual content configured to be rendered from the XR application. Each XR application can thus maintain an updated list of virtual content fences that take into account the location of any virtual content configured for rendering at the XR application. The updated list of virtual content fences can be used to determine if the computing system 100 is at or nearing a location and/or orientation from where virtual content is visible or should be rendered, which can trigger the higher-power processing 220 to be initiated or resumed to render such virtual content or in anticipation of such virtual content being rendered. In some examples, a user can define, update, and/or modify one or more virtual content fences associated with one or more XR applications. For example, a user may interact with the computing system 100 and/or a specific XR application to define one or more virtual content fences for virtual content associated with the XR application.

In some implementations, the wake parameters can specify that escalation from the lower-power processing 204 to the higher-power processing 220 should be triggered when a configurable percentage of in-state features from the feature map data available to the lower-power processor 116 is untrackable from a location and/or orientation of the computing system 100. Such in-state features can become untrackable when, for example, the orientation of the computing system 100 changes a certain amount, the computing system 100 and such features become too far away to track, there is an obstruction that prevents such features from being tracked from the location and/or orientation of the computing system 100.

In other implementations, the wake parameters can specify that escalation from the lower-power processing 204 to the higher-power processing 220 should be triggered when a configurable movement velocity threshold is exceeded by the computing system 100, as determined by the sensors 130 and/or the lower-power processor 116 (e.g., via the lower-power initiator 202).

In other implementations, the wake parameters can specify that escalation from the lower-power processing 204 to the higher-power processing 220 should be triggered when a configurable amount of time has passed since the lower-power processing 204 was triggered or performed (e.g., when the lower-power processing 204 has been running for a configurable amount of time), when a configurable amount of time has passed since the higher-power processing 220 was triggered or performed, and/or when a configurable amount of time has passed since the renderer (e.g., GPU 106) was used to render content. In some cases, the amount of time can be lower in dynamic environments where the feature map may need to be updated more frequently. For example, the amount of time can be lowered in a dynamic environment to trigger more frequent localization and/or mapping operations, even if the computing system 100 is not moving a lot or is farther away from any virtual content configured for rendering. Non-limiting examples of dynamic environments can include an environment where things or objects in the environment can move or change at a faster pace than more static environments, such as a vehicle or an airport; an environment where physical spaces can change at a faster pace than more static environments, such as a conference room or factory; an environment where the computing system 100 may transition from one physical space to a different physical space at a higher frequency or with less movement than in other, more static environments, such as a building with many and/or smaller rooms or hallways; etc.

In some cases, the amount of time specified by the wake parameters for triggering the higher-power processing 220 can vary based on battery or thermal conditions at the computing system 100. For example, when battery power levels at the computing system 100 are higher, the timer values can be decreased to trigger more frequent escalation to the higher-power processing 220, which can provide higher-fidelity tracking and perform localization and mapping updates. On the other hand, when battery power levels at the computing system 100 are lower, the timer values can be increased to trigger less frequent escalation to the higher-power processing 220 in order to conserve more power. In some cases, the lower-power initiator 202 can similarly implement timer values for triggering virtual content timeout and lower-power processing 204 based on battery or thermal conditions.

By using timer values, the lower-power initiator 202 and/or the lower-power wake handler 212 can provide flexibility in the aggressiveness of the lower-power processing 204 entry and exit. For example, the timer values can be adjusted to increase or decrease the amount of time or frequency of the lower-power processing 204 and/or the higher-power processing 220. In some examples, entry into the lower-power processing 204 can be biased to be less common during forgiving thermal conditions and/or high battery scenarios and more common during high thermal conditions and/or low battery scenarios, while exit to the higher-power processing 220 can be biased to be faster during forgiving thermal conditions and/or high battery scenarios and slower during high thermal conditions and/or low battery scenarios.

In some implementations, the wake parameters can include specific time intervals at which higher-power processing 220 should be initiated or resumed to perform relocalization. For example, in some cases, the lower-power processing 204 can perform lower-fidelity tracking. The lower-fidelity tracking can be more susceptible to tracking errors and inaccuracies resulting from, for example, drift, frequent movements, faster motion. To correct, prevent, and/or reduce such tracking errors and inaccuracies, the wake parameters can specify certain time intervals that should trigger higher-power processing 220 to perform relocalization. Once relocalization is complete, the lower-power processing 204 can be resumed for power savings, unless a wake parameter for triggering higher-power processing 220 is satisfied, in which the higher-power processing 220 can continue until the lower-power initiator 202 determines that lower-power processing 204 should be initiated, as previously explained.

In some implementations, the lower-power processor 116 can use both inertial data 230 and image data 232 to perform the lower-power processing 204. For example, the computing system 100 may have always-on or low-power camera hardware that allows the SoC 102 on the computing system 100 to obtain and use image data (232) at lower power levels than other camera hardware. Thus, the lower-power processor 116 can implement image data (232) in addition to inertial data (230) for the lower-power processing 204, and still achieve significant power savings through the lower-power processing 204 and powering off some or all of the higher-power processing elements.

In other implementations, the lower-power processor 116 may use inertial data (230) and may not use image data (232) to perform the lower-power processing 204. For example, in some cases, the computing system 100 and/or the SoC 102 may not have always-on or low-power camera hardware. Instead, the computing system 100 and/or the SoC 102 may have camera hardware (or no camera hardware in non-AR uses cases, for example) with higher power requirements which may reduce or obviate the power savings of the lower-power processing 204. In such cases, the lower-power processing 204 may perform inertial-only tracking. The SoC 102 may power off the higher-power processing elements during such inertial-only tracking to provide additional power savings as previously explained. In some cases, the wake parameters may provide a configurable wake timer to periodically trigger relocalization via the higher-power processing 220 to manage (e.g., correct, mitigate) drift from the inertial-only tracking.

The lower-power processor 116 can also use the control system elements 118 for clock generation. The control system elements 118 can have lower power requirements than the control system elements 112 implemented by the processors (e.g., 104-110) from the higher-power processing elements. For example, in some cases, the control system elements 112 from the higher-processing elements can include PLLs, while the control system elements 118 from the lower-power processing elements may instead implement ring oscillators which have lower power requirements than PLLs.

In some implementations, the control system elements 118 can include ring oscillators 216 as well as smaller PLLs 214 with lower power requirements. For example, the control system elements 118 can have ring oscillators on shift that power smaller PLLs for clock generation. In other implementations, the control system elements 118 may include ring oscillators directly implemented for clock generation. By using ring oscillators for clock generation or to power smaller PLLs for clock generation, the control system elements 118 can provide power savings over the control system elements 112 implemented in the higher-power processing elements.

Figure 3A:
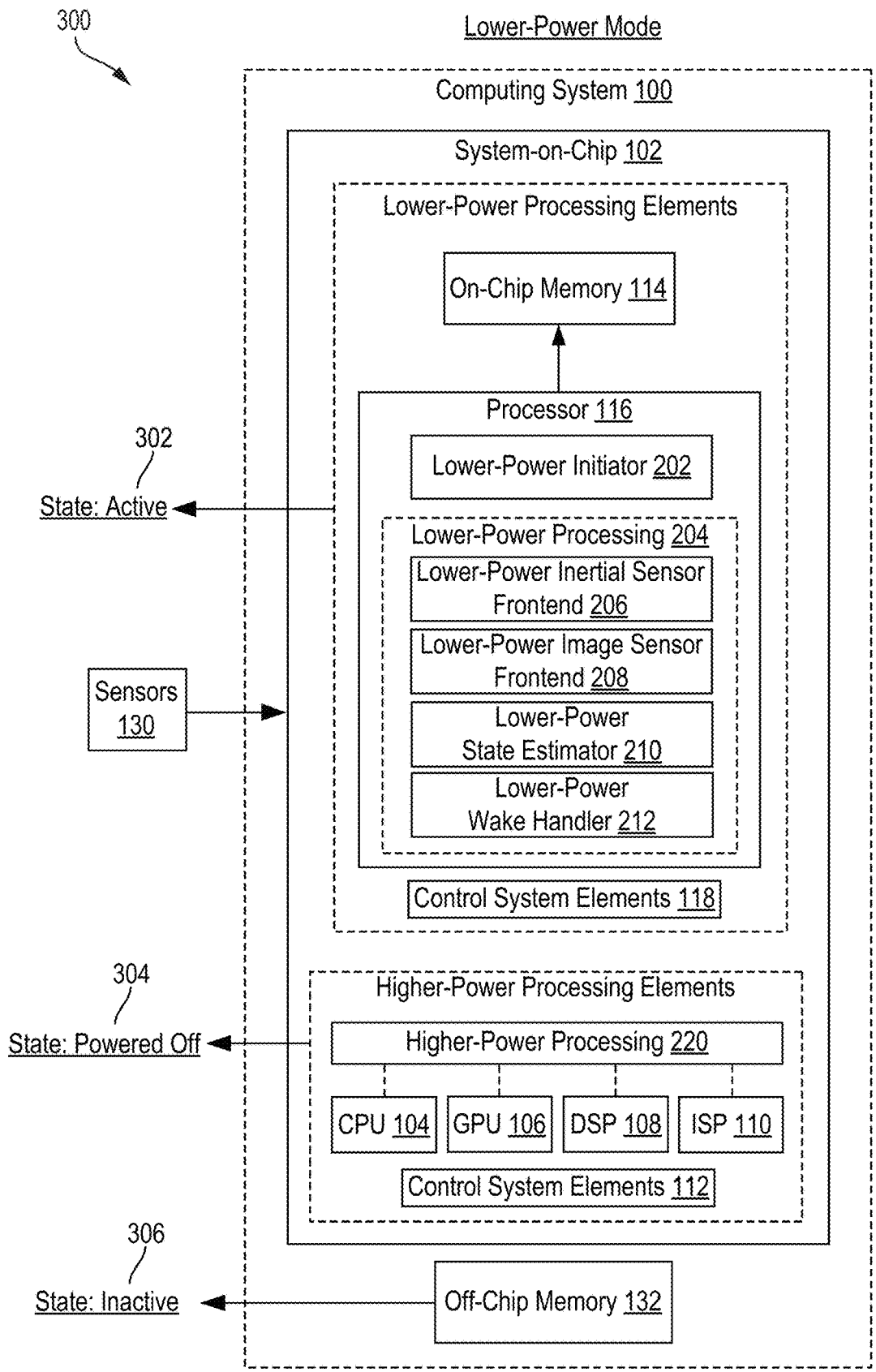
FIG. 3A illustrates an example of system-on-chip running in a lower-power mode, in accordance with some examples of the present disclosure.

FIG. 3A illustrates an example of the SoC 102 on the computing system 100 running in a lower-power mode 300. In some cases, the SoC 102 can begin in the lower-power mode 300 when the computing system 100 is started or becomes active, and can remain in the lower-power mode 300 until the lower-power wake handler 212 triggers a switch to a higher-power mode and initiates higher-power processing 220 at the SoC 102. In other cases, the SoC 102 can begin in a higher-power mode or can begin in either the lower-power mode 300 or a higher-power mode depending on a current system state, current system conditions, operations to be performed, user preferences, etc. If the SoC 102 was previously in a higher-power mode, the SoC 102 can transition to the lower-power mode 300 when the lower-power initiator 202 determines that lower-power processing 204 should be initiated and issues an instruction to initiate the lower-power processing 204.

When the SoC 102 is running in the lower-power mode 300, the lower-power processing elements in the SoC 102 can have an active state 302 as they perform the lower-power processing 204. During this period, the lower-power processor 116 can implement the lower-power initiator 202, the lower-power inertial sensor frontend 206, the lower-power image sensor frontend 208, the lower-power state estimator 210, and/or the lower-power wake handler 212, to perform the lower-power processing 204 using data from the sensors 130.

Moreover, when in the lower-power mode 300, the lower-power processor 116 can use the on-chip memory 114 (e.g., SRAM) to run the lower-power processing 204. For example, the lower-power processor 116 can use the on-chip memory 114 to store and retrieve information such as tracking information, map data, sensor measurements, parameters. The on-chip memory 114 can consume less power than the off-chip memory 132 (e.g., DRAM), and can thus provide power savings during the lower-power processing 204 and the lower-power mode 300. The lower-power processor 116 can also use the control system elements 118 for clock generation. As previously explained, the control system elements 118 used by the lower-power processor 116 can consume less power than the control system elements 112 from the higher-power processing elements, and can thus provide additional power savings.

On the other hand, when the SoC 102 is in the lower-power mode 300, the higher-power processing elements (e.g., 104-112) can have a powered-off state 304. The powered-off state 304 can provide significant power savings and improved thermal conditions during the lower-power mode 300 by preventing power usage, power leakage, and/or idle power by the higher-power processing elements, which as previously explained have higher power requirements than the lower-power processing elements. In some implementations, all of the higher-power processing elements, including the CPU 104, GPU 106, DSP 108, ISP 110, control system elements 112, and any other hardware or electronic components in the SoC 102 (except the lower-power processing elements) can be powered-off during the lower-power mode 300. In other implementations, one or more of the higher-power processing elements can remain powered on and in an active or inactive state during part of the time or all of the time that the SoC 102 is in the lower-power mode 300.

For example, in some cases, the CPU 104 or the DSP 108 can wake up (e.g., power on or switch from an inactive state to an active state) at configurable intervals of time during the lower-power mode 300 to monitor the sensors 130, communicate with the lower-power processing elements (e.g., communicate state information, communicate map information, communicate parameters, report events, respond to queries), remain on standby, listen for wake events, and/or perform other system operations. As another example, in some cases, the GPU 106 can wake up at configurable intervals of time during the lower-power mode 300 to monitor or manage virtual content fences, communicate with the lower-power processing elements (e.g., communicate information about virtual content fences, communicate rendering information, report events, provide updates), remain on standby, etc.

Moreover, when the SoC 102 is in the lower-power mode 300, the off-chip memory 132 (e.g., DRAM) can also have an inactive state 306. Since the lower-power processing elements can use the on-chip memory 114 instead of the off-chip memory 132 during the lower-power mode 300 and the higher-power processing elements are in a powered-off state 304 and thus may not need to use the off-chip memory 132, the off-chip memory 132 can be in the inactive state 306 during the lower-power mode 300. The off-chip memory 132 can remain in the inactive state 306 until the SoC 102 switches to a higher-power mode and/or the off-chip memory 132 is used by other components in the computing system 100.

Figure 3B:
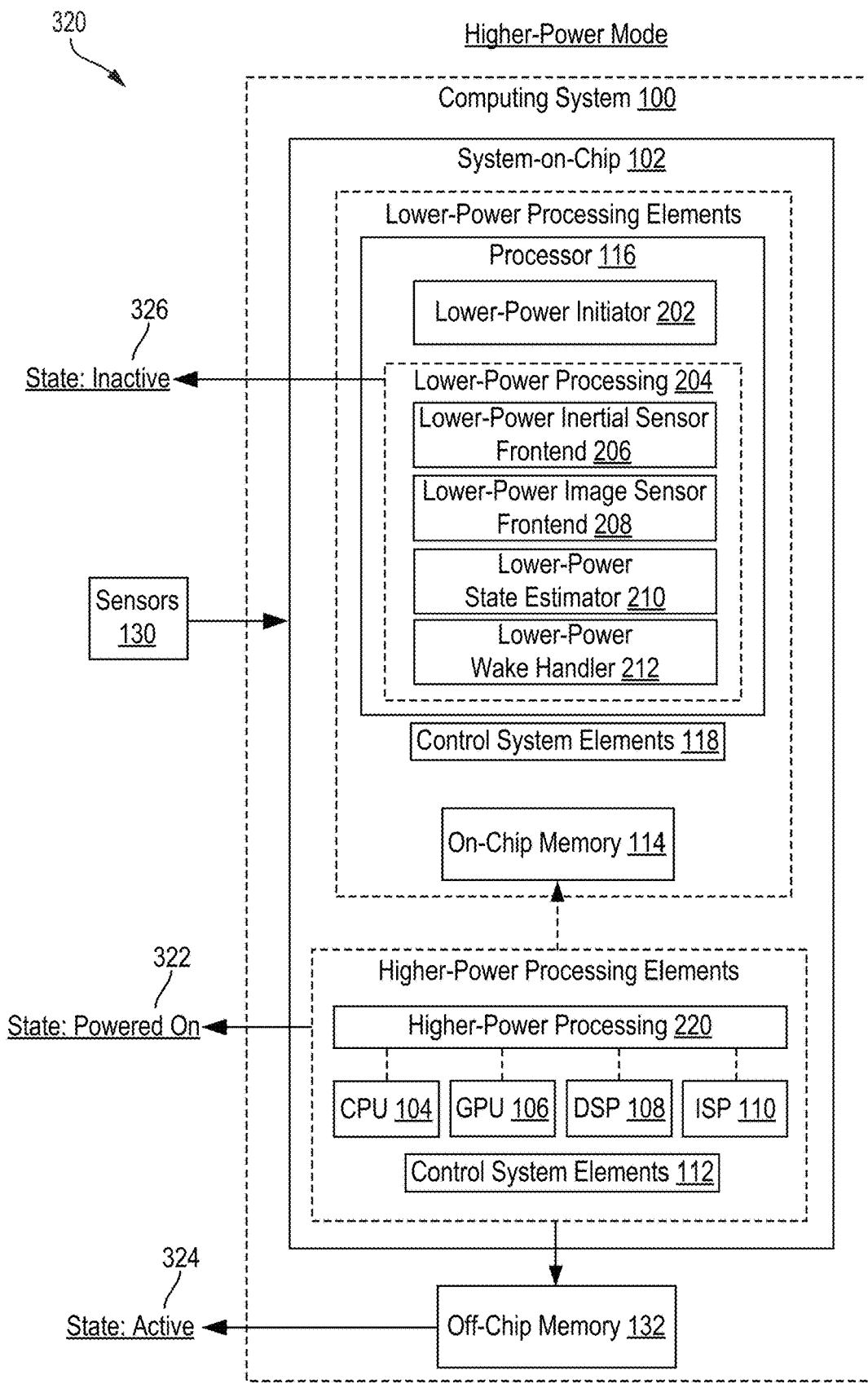
FIG. 3B illustrates an example of system-on-chip running in a higher-power mode, in accordance with some examples of the present disclosure.

FIG. 3B illustrates an example of the SoC 102 on the computing system 100 running in a higher-power mode 320. In some cases, the SoC 102 can begin in the higher-power mode 320 when the computing system 100 is started or becomes active, and can remain in the higher-power mode 320 until the lower-power initiator triggers a switch to the lower-power mode 300 to initiate lower-power processing at the SoC 102. In other cases, the SoC 102 can begin in the lower-power mode 300 or can begin in either the lower-power mode 300 or the higher-power mode 320 depending on a current system state, current system conditions, operations to be performed, user preferences, etc. If the SoC 102 was previously in the lower-power mode 300, the SoC 102 can transition to the higher-power mode 320 when the lower-power wake handler 212 detects a wake event or parameter and issues a wake instruction to escalate the current power mode and processing from the lower-power mode 300 and lower-power processing 204 to the higher-power mode 320 and higher-power processing 220.

When the SoC 102 is running in the higher-power mode 320, the higher-power processing elements (e.g., 104-112) can have a powered on state 322. During this time, the lower-power processing 204 can remain in an inactive state 326 and the higher-power processing elements can instead perform higher-power processing 220. While in the powered on state 322, the higher-power processing elements can also perform any other configured operations such as rendering operations, mapping operations, localization operations, monitoring operations, management operations, state prediction operations, filtering operations, AR operations, image signal processing operations, virtual content fence management operations, positional audio operations, and throttling operations.

In some cases, when the SoC 102 switches from lower-power processing 204 to higher-power processing 220, the higher-power processing 220 may need to perform relocalization. For example, the lower-fidelity tracking performed during the lower-power processing 204 can, in some cases, encounter drift, inaccuracies and even lose track of the location of the computing system 100 relative to the map data (e.g., the mapped features). The higher-power processing 220 may thus perform relocalization to correct or mitigate these issues.

In some examples, the lower-power processor 116 can be active during some or all of the time that the SoC 102 is in the higher-power mode 320. For example, in some cases, the lower-power processor 116 can monitor the sensors 130 during the higher-power mode 320 and/or listen for events or communications from the higher-power processing elements. In other examples, the lower-power processor 116 can run the lower-power initiator 202 to check for any events or conditions that may trigger a switch to the lower-power mode 300 and the lower-power processing 204. In this example, the lower-power processor 116 can run the lower-power initiator 202 during the higher-power mode 320 (e.g., periodically or during the entire time), which can monitor events and parameters to determine whether lower-power processing 204 should be initiated.

Moreover, the off-chip memory 132 can be in an active state 324 during the higher-power mode 320. The higher-power processing elements can use the off-chip memory 132 for the higher-power processing 220. The higher-power processing elements can use the off-chip memory 132 for any other operations performed by the higher-power processing elements such as rendering operations, mapping operations, localization operations, monitoring operations, management operations, state prediction operations, filtering operations, AR operations, image signal processing operations, and virtual content fence management operations.

As previously described, FIGS. 3A and 3B illustrate various functional components (e.g., 202, 206, 208, 210, 212) which implement and/or manage lower-power processing and higher-power processing modes. It should be understood that such functional components can each be implemented and/or managed by one or more circuit elements and/or hardware components such as the CPU 104, the GPU 106, the DSP 108, the ISP 110, the control system elements 112, the on-chip memory 114, the processor 116, the control system elements 118, and/or the off-chip memory 132. In some cases, a functional component can be implemented by a combination of such circuit elements and/or hardware components.

FIG. 4A illustrates a table 400 of example virtual content fences configured for triggering escalation from the lower-power processing 204 to the higher-power processing 220. For example, the lower-power initiator 202 can use the virtual content fences in table 400 to determine whether to suspend lower-power processing 204 and initiate higher-power processing 220 based on a comparison between the tracked pose of the computing system 100 and location and/or orientation parameters in the virtual content fences.

In some examples, the lower-power initiator 202 can obtain the virtual content fences in table 400 from a renderer (e.g., the GPU 106) on the computing system 100. The renderer can maintain a list of virtual content configured to be rendered at the computing system 100 as well as any parameters associated with the virtual content, for example, the location of the virtual content within a mapped space/scene (e.g., the location where the virtual content is anchored/configured). In some cases, the renderer can use the list of virtual content configured to be rendered to determine the virtual content fences and provide the virtual content fences to the lower-power processor 116 and/or the lower-power initiator 202 for use in determining when to trigger or initiate the higher-power processing 220. In other cases, the renderer can provide to the lower-power processor 116 and/or the lower-power initiator 202 some or all of the information in the list of virtual content configured to be rendered, which the lower-power processor 116 and/or the lower-power initiator 202 can use to determine the virtual content fences.

In other examples, the lower-power initiator 202 can obtain the virtual content fences in table 400 from one or more applications on the computing system 100. For example, each AR application on the computing system 100 can maintain a list of any virtual content configured on that AR application for rendering as well as any associated parameters, for example, the location of the virtual content within a mapped space/scene (e.g., the location where the virtual content is anchored/configured). Based on the information about the virtual content configured at each AR application, each AR application can provide respective virtual content fences to be used for triggering the higher-power processing 220. In some cases, each AR application can vote on location and/or orientation information or ranges that can be used to configure the virtual content fences. Each AR application can vote based on the virtual content and associated information configured at that AR application (if any).

In FIG. 4A, the example table 400 of virtual content fences can include a virtual fence identifier column 402 which can be used to identify the virtual content fences configured in the table 400, a set of coordinate columns 404-414 defining ranges of location parameters for the virtual content fences in table 400, and a set of orientation columns 416-426 defining ranges of orientation parameters (e.g., pitch, roll, yaw) for the virtual content fences in table 400.

For example, column 404 can define a minimum location value on an X axis in a three-dimensional (3D) coordinate system representing a 3D space, column 406 can define a maximum location value on the X axis in the three-dimensional (3D) coordinate system, column 408 can define a minimum location value on a Y axis in the three-dimensional (3D) coordinate system, column 410 can define a maximum location value on the Y axis in the three-dimensional (3D) coordinate system, column 412 can define a minimum location value on a Z axis in the three-dimensional (3D) coordinate system, and column 414 can define a maximum location value on the Z axis in the three-dimensional (3D) coordinate system. Moreover, column 416 can define a minimum pitch value, column 418 can define a maximum pitch value, column 420 can define a minimum yaw value, column 422 can define a maximum yaw value, column 424 can define a minimum roll value, and column 426 can define a maximum roll value.

The lower-power wake handler 212 can use the values in the set of coordinate columns 404-414 and the set of orientation columns 416-426 defined for a virtual content fence to determine whether to trigger the higher-power processing 220. For example, the lower-power wake handler 212 can compare the tracked location and orientation of the computing system 100 with the values in the columns 404-426 to determine if the location and orientation of the computing system 100 is within the location and orientation ranges defined in the columns 404-426 for any particular virtual content fence. If the lower-power wake handler 212 determines that a particular virtual content fence has been breached (e.g., the location and orientation of the computing system 100 is within the location and orientation ranges defined in the columns 404-426 for that particular virtual content fence), the lower-power wake handler 212 can trigger the higher-power processing 220.

For example, table 400 illustrates virtual content fences 428-430 configured for triggering the higher-power processing 220 based on the location and orientation of the computing system 100. Each of the virtual content fences 428-430 defines values for the location columns 404-414 and the orientation columns 416-426, which the lower-power wake handler 212 can use to determine if the computing system 100 is in breach of any of the virtual content fences 428-430. If the lower-power wake handler 212 determines that the location and orientation of the computing system 100 is within the location and orientation ranges defined in columns 404-426 for the virtual content fence 428 or 430, the lower-power wake handler 212 can suspend the lower-power processing 204 and initiate the higher-power processing 220.

Alternatively, if the lower-power wake handler 212 determines that the location and orientation of the computing system 100 is not within the location and orientation ranges defined in columns 404-426 for the virtual content fence 428 or 430, the lower-power wake handler 212 can allow the lower-power processing 204 to continue, unless higher-power processing 220 is triggered by another event such as a timer value configured for timer-based triggering of the higher-power processing 220.

In some cases, instead of defining location and orientation ranges, the virtual content fences can define exact location and orientation values which can trigger the higher-power processing 220 when the location and orientation of the computing system 100 match such location and orientation values. In other cases, the virtual content fences can be configured to be dynamic. For example, when virtual content fences are specified, each virtual content fence parameter can include a growth rate parameter indicating the speed at which to add or subtract from the virtual content fence parameter. To illustrate, a virtual content fence specifying a specific minimum pitch and a specific maximum pitch can include a growth parameter of $-n°$ per second specified for the minimum pitch and $+n°$ per second specified for the maximum pitch. Such dynamic virtual content fences can allow for expression of movement or growth of virtual objects over time and can be used to deal with uncertainty of accumulated error in the lower-power processing 204.

FIG. 4B illustrates other example virtual content fences. In this example, the virtual content fences are defined based on location parameters of virtual content objects and occlusion parameters associated with occlusions that may block a visibility of the virtual content objects. In FIG. 4B, the location parameters for the virtual content objects are defined in table 440 and the occlusion parameters are defined in table 460.

Table 440 includes a virtual content object identifier column 442 identifying specific virtual content objects 456-458 in the table 440, and coordinate columns 444-454 defining ranges of location parameters for the virtual content objects 456-458. For example, the virtual content objects 456-458 defined in table 440 include respective minimum and maximum location values along the X, Y, and Z axes, which are defined in the coordinate columns 444-454. On the other hand, table 460 includes an occlusion identifier column 462 identifying specific occlusions 476-478 in the table 460, and coordinate columns 464-474 defining ranges of location parameters for the occlusions 476-478. For example, the occlusions 476-478 defined in table 460 include respective minimum and maximum location values along the X, Y, and Z axes, which are defined in the coordinate columns 464-474.

The lower-power wake handler 212 can use the values in the set of coordinate columns 444-454 defined in table 440 and the values in the set of coordinate columns 464-474 defined in table 460 for the virtual content objects 456-458 and the occlusions 476-478 to determine whether to trigger the higher-power processing 220. For example, the lower-power wake handler 212 can compare the tracked location of the computing system 100 with the values in the columns 444-454 defined in table 440 and the values in the columns 464-474 defined in table 460 for the virtual content objects 456-458 and the occlusions 476-478 to determine if a particular virtual content object is visible from the tracked location of the computing system 100. If the location of the computing system 100 is within the location ranges defined in the coordinate columns 444-454 in table 440 for a particular virtual content object (444, 446) but is not within any of the location ranges defined in the coordinate columns 464-474 in table 460 for the occlusions 476-478, the lower-power wake handler 212 can determine that the particular virtual content object is visible from the location of the computing system 100. If the lower-power wake handler 212 determines that a particular virtual content object is visible, the lower-power wake handler 212 can suspend the lower-power processing 204 and initiate the higher-power processing 220.

On the other hand, if the location of the computing system 100 is not within the location ranges defined in the coordinate columns 444-454 in table 440 for any of the virtual content objects 456-458 and/or if the location of the computing system 100 is within the location ranges defined in the coordinate columns 464-474 in table 460 for any of the occlusions 476-478, the lower-power initiator 202 can determine that none of the virtual content objects 456-458 are visible from the location of the computing system 100. If the lower-power wake handler 212 determines that none of the virtual content objects 456-458 are visible from the location of the computing system 100, the lower-power wake handler 212 can allow the lower-power processing 204 to continue.

In some cases, table 440 and/or table 460 can also include orientation columns defining ranges of orientation parameters (e.g., pitch, roll, yaw), which can be used by the lower-power wake handler 212 to determine whether any virtual content objects are visible from the location and orientation of the computing system 100. In such cases, the lower-power wake handler 212 can compare the location and orientation of the computing system 100 with the location and orientation values defined in table 440 and/or table 460 to determine whether a particular virtual content object is visible from the location and orientation of the computing system 100.

Figure 5:
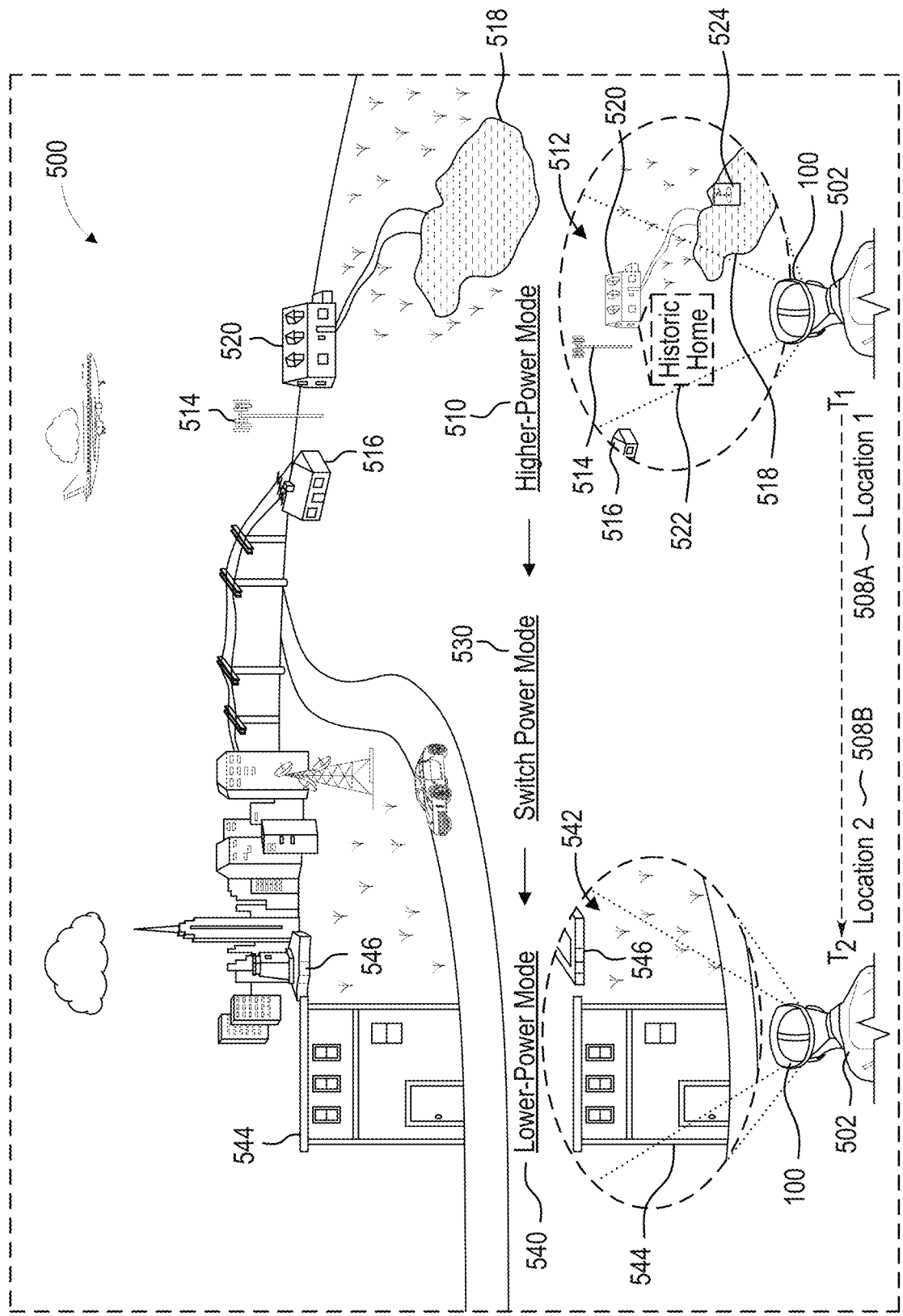
FIG. 5 illustrates an example use case for switching from a higher-power mode to a lower-power mode for power savings, in accordance with some examples of the present disclosure.

FIG. 5 illustrates an example use case 500 for switching from a higher-power mode 510 to a lower-power mode 540 for power savings. In this example use case 500, the computing system 100 represents AR glasses worn by a user 502 to obtain an AR experience through the AR glasses. As further described below, the SoC 102 in the computing system 100 can run in higher-power mode 510 when the user 502 is at location 508A, and switch 530 to lower-power mode 540 when the user 502 is at location 508B. The switch 530 can be performed by the lower-power initiator 202 based on a tracked pose of the computing system 100 and/or a triggering event or condition, as previously described.

During the higher-power mode 510, the higher-power processing elements in the SoC 102 on the computing system 100 can run the higher-power processing 220 in order to perform higher-fidelity tracking and render virtual content objects 522-524 within a mapped scene 512 visible by the user 502 from the location 508A. In some cases, the higher-power processing elements in the SoC 102 can also perform mapping operations (e.g., via the higher-power processing 220) during the higher-power mode 510. The virtual content objects 522-524 are rendered by the higher-power processing elements in the SoC 102 for viewing by the user 502 from the location 508A. Moreover, the virtual content objects 522-524 are anchored to specific locations within the mapped scene 512 for rendering by the higher-power processing elements in the SoC 102 when the specific locations within the mapped scene 512 are visible from the computing system 100. The virtual content objects 522-524 can be rendered when the specific locations within the mapped scene 512 are visible from the computing system 100 in order to provide a realistic spatio-temporal AR content experience.

The mapped scene 512 includes visual features 514-520 from the scene and the virtual content objects 522-524 rendered within the mapped scene 512. The virtual content objects 522-524 can include digital and/or multimedia content such as a virtual object, a virtual scene, a virtual overlay, a virtual view, interactive virtual content, audio, computer-generated imagery, a virtual simulation, a virtual game, and a virtual interface. In some cases, the virtual content objects 522-524 can include one or more visual or special effects, such as animations, simulations, optical effects, and mechanical effects.

When the user 502 wearing the computing system 100 moves from location 508A to location 508B, the lower-power initiator 202 can initiate the lower-power mode 540 based on the new pose of the computing system 100. For example, the lower-power initiator 202 can determine that no virtual content objects are anchored to, and/or visible from, a scene 542 at location 508B. The scene 542 can include real-world items 544-546 that are visible from the location 508B. In some examples, the lower-power initiator 202 can obtain a visual feature map and/or one or more mapped features, which can include in-state features corresponding to the scene 542. In some cases, the visual feature map and/or the one or more mapped features can also include one or more out-of-state features that are not visible from the scene 542. Moreover, the lower-power initiator 202 can obtain a visual feature map and/or one or more mapped features from the higher-power processing elements on the SoC 102.

During the lower-power mode 540, the lower-power processor 116 in the SoC 102 runs the lower-power processing 204 to continue to track the pose of the computing system 100 at reduced power levels in order to conserve power. Moreover, the higher-power processing elements can be powered off during the lower-power mode 540 to provide additional power savings. The SoC 102 can continue in the lower-power mode 540 until the lower-power wake handler 212 detects a wake event or condition and escalates to the higher-power mode 510, as previously described.

In some cases, during the lower-power mode 540, the SoC 102 can briefly switch back to the higher-power mode 510 at one or more intervals to perform relocalization or higher-fidelity tracking in order to correct, improve and/or prevent tracking errors or inaccuracies from the lower-power processing 204. The SoC 102 can then return to the lower-power mode 540, unless the lower-power wake handler 212 determines that the SoC 102 should remain in the higher-power mode 510.

Having described example systems and technologies, the disclosure now turns to the example flowchart 600 and method 700 shown in FIGS. 6 and 7. The steps outlined in the flowchart 600 and method 700 are examples and can be implemented in any combination thereof, including combinations that exclude, add, or modify certain steps.

FIG. 6 illustrates an example flowchart 600 for switching between higher-power processing and lower-power processing for power savings in example pose estimation and tracking applications. In this example, at step 602, the higher-power processing elements (e.g., 104-112) on the SoC 102 of the computing system 100 can receive sensor data (e.g., 230, 232). The higher-power processing elements can receive the sensor data from one or more sensors 130, such as an image sensor and an inertial sensor.

At step 604, the higher-power processing elements can use the sensor data to perform higher-power processing (220). The higher-power processing can provide higher-fidelity pose estimation and tracking. For example, the higher-power processing can perform higher-fidelity tracking of the computing system 100. In some examples, the higher-power processing can include, for example, 6 DoF tracking, localization, mapping, VIO, and/or XR operations (e.g., virtual content anchoring and rendering). As part of the higher-power processing, the higher-power processing elements can generate a map (e.g., a visual feature map) of a scene (e.g., 512) associated with the computing system 100.

The scene can include, for example and without limitation, a room, a building, a stadium, a vehicle, an outdoor area, a store, a house, an office, a parking lot, a garage, a park, a facility, a factory, a stadium.

The map can chart, plot, model, and/or identify features of/in the scene, such as objects, space, characteristics (e.g., shape, volume, size, position), and humans. In some implementations, the map can be a two-dimensional (2D) or three-dimensional (3D) grid or model of the scene and can include multiple map or feature points. In some examples, the map can include in-state features and/or out-of-state features as previously described. Moreover, the higher-power processing elements can use the map to track mapped features and render virtual object(s) at specific locations within the scene where the virtual object(s) are anchored/set.

At step 606, the lower-power initiator 202 can determine whether lower-power processing (204) should be initiated. If the determination result is "YES", the flowchart will turn to step 608. If the determination result is "NO", the flowchart will turn to step 604. In some cases, the lower-power initiator 202 can determine that lower-power processing can be initiated if the higher-power processing elements are not performing mapping or rendering operations and the lower-power initiator 202 does not expect that mapping or virtual content rendering operations will be performed or needed for some time into the future.

For example, to provide AR functionality, the higher-power processing elements can continuously track a state (e.g., pose) of the computing system 100 to ensure that AR content is timely and accurately rendered (e.g., rendered at a correct time and location) and the AR experience is realistic. However, to save power at times when mapping and rendering operations are not expected to be implemented, the lower-power initiator 202 can suspend the higher-power processing and switch to lower-power processing, which can continue to track the state of the computing system 100 though at lower-power levels and/or lower fidelity. When the lower-power processing is running, some or all of the higher-power processing elements can be powered off to reduce power usage.

In other cases, the lower-power initiator 202 can determine that lower-power processing can be initiated if the computing system 100 is determined to be in a pre-mapped area (e.g., a pre-mapped physical space), which can indicate that it is acceptable to use non-mapping tracking and/or pose estimation. Moreover, in some cases, the lower-power initiator 202 can determine that lower-power processing can be initiated if the rotational and translational motion of the computing system 100 is below a configurable threshold, which can indicate that a change in pose that will trigger a need to perform mapping or rendering operations is not likely to occur for at least some time into the future. The lower-power initiator 202 can determine whether the computing system 100 is in a pre-mapped area or the rotational and translational motion of the computing system 100 is below a configurable threshold based on sensor data (e.g., inertial data 230 and/or image data 232) from the sensors 130, which can be used to estimate a pose of the computing system 100.

In some cases, the lower-power initiator 202 can determine that lower-power processing 204 can be initiated if there is no anchored or configured virtual content visible (e.g., within a field of view (FOV) or being rendered) or likely to be visible for at least some time into the future. In some examples, the lower-power initiator 202 can determine that there is no virtual content visible or likely to be visible when the content renderer (e.g., the GPU 106) has not been used for a configurable amount of time. In other examples, the lower-power initiator 202 can implement a voting scheme in which each AR or virtual content application on the computing system 100 votes on whether to allow lower-power processing at a current time or in the near future. Each application can vote on whether to allow lower-power processing based on whether the application expects virtual content to be rendered at a current time or within a configurable period of time. In some examples, each application can determine if virtual content is expected to be rendered based on the location of any virtual content anchored or configured for use by that application.

Moreover, in some AR use cases, the lower-power initiator 202 can determine that lower-power processing 204 can be initiated if the computing system 100 is performing head-locked rendering. For example, if the computing system 100 is only rendering head-locked layers, the tracking fidelity may be relaxed as if no virtual content is being rendered. Thus, the lower-power initiator 202 can optionally allow lower-power processing 204 during such head-locked rendering.

If the lower-power initiator 202 determines that lower-power processing 204 can be initiated, at step 608 the lower-power initiator 202 can suspend the higher-power processing and switch to lower-power processing. In some cases, when switching to lower-power processing, some or all of the higher-power processing elements can be powered off and remain powered off until further used.

At step 610, the lower-power processor 116, which performs the lower-power processing, can receive map data from the higher-power processing elements. The lower-power processor 116 can use the map data for the lower-power processing. In some examples, the higher-power processing elements can transfer to the lower-power processor 116 the entire map. In other examples, the higher-power processing elements can transfer to the lower-power processor 116 a subset of a map (e.g., a slice of the map, a subset of features or map points from the map).

The subset of the map can include, for example, in-state features from the map. In some cases, the subset of the map can also include a portion of out-of-state features estimated to be used by, or relevant to, the lower-power processor 116 at least some time into the future (e.g., within a certain amount of time). The out-of-state features can be estimated to be in use or relevant in the future based on a pose of the computing system 100, a movement (e.g., velocity, direction or trajectory) of the computing system 100, a proximity of the computing system 100 to such out-of-state features, an amount of movement of objects corresponding to such out-of-state features, etc.

At step 612, the lower-power processor 116 can receive sensor data (e.g., 230, 232) from the sensors 130. The sensor data can be used by the lower-power processor 116 to perform the lower-power processing. Moreover, the sensor data can include, for example, image data (e.g., frames), inertial data (e.g., roll, pitch, yaw measurements). In some cases, the lower-power processor 116 can receive both image data and inertial data, which it can use for tracking. In other cases, the lower-power processor 116 may only receive inertial data, which it can use to perform inertial-only tracking.

In some cases, the sensors used by the lower-power processor 116 to obtain the sensor data can be the same sensors used by the higher-power processing elements to obtain sensor data for the higher-power processing. In other cases, the sensors used to obtain the sensor data for the lower-power processing can be different sensors. For example, the sensors used for the lower-power processing can include lower-power or lower-fidelity sensors such as always-on/lower-power/lower-resolution camera hardware for image data, and always-on/lower-power inertial sensors for inertial measurements.

At step 614, the lower-power processor 116 can perform the lower-power processing 204. During the lower-power processing 204, the lower-power processor 116 can track a state (e.g., pose) of the computing system 100 (e.g., via lower-power state estimator 210). The lower-power processor 116 can track the state of the computing system 100 using the received sensor data. Moreover, in some examples, during the lower-power processing, the lower-power processor 116 can use the map data obtained from the higher-power processing elements to track mapped features.

In some cases, to track the state of the computing system 100, the lower-power processor 116 can use image data and inertial data. In other cases, the lower-power processor 116 can use inertial data to perform inertial-only tracking. For example, if the computing system 100 does not have an image sensor or does not have always-on or low-power camera hardware, the lower-power processor 116 may only use inertial data to track the state of the computing system. To prevent, reduce, or correct drift from the inertial-only tracking, the lower-power processor 116 (e.g., via the lower-power wake handler 212) can periodically (e.g., based on a wake timer) trigger relocalization using the higher-power processing and higher-power processing elements.

In some examples, the lower-power processor 116 can perform temporal filtering and sensor fusion to estimate the position/location and orientation of the computing system 100. In some examples, the lower-power processor 116 can process measurements or observations from the sensor data (e.g., inertial data 230 and/or image data 232) through one or more filters (e.g., one or more Kalman filters, one or more extended Kalman filters) that estimate a state (e.g., location, orientation, velocity, trajectory, acceleration, position, altitude) and error covariance for the computing system 100. For example, the lower-power processor 116 can implement one or more filters, one or more motion models (e.g., one or more acceleration models, one or more angular rate models, one or more velocity models), and/or any other tracking algorithm(s) or model(s) to estimate a state of the computing system 100.

When performing lower-power processing, the lower-power processor 116 can estimate, track, and/or predict a pose of the computing system 100. In some implementations, the pose of the computing system 100 can be correlated or associated with the pose of a user. For example, if the user is carrying or wearing the computing system 100, the pose of the computing system 100 can move in synchrony with a user's pose, and thus can be correlated or associated with the user's pose. However, in other implementations, a user may have a different or separate pose relative to the computing system 100. For example, a head-up display (HUD) used to render virtual content can have a different or separate pose relative to a user viewing the HUD.

At step 616, the lower-power processor 116 can determine (via the lower-power wake handler 212) whether to escalate from the lower-power processing to the higher-power processing. If the determination result is "YES", the flowchart will turn to step 604. If the determination result is "NO", the flowchart will turn to step 614. In some examples, the lower-power processor 116 can determine whether to suspend the lower-power processing and initiate or resume the higher-power processing based on one or more wake events or parameters. For example, the lower-power processor 116 can monitor and recognize pre-programmed wake events and parameters (e.g., triggers, conditions) for initiating or resuming the higher-power processing. In some cases, the lower-power processor 116 can analyze state information (e.g., pose information) to determine whether to suspend lower-power processing and initiate or resume higher-power processing.

In some examples, the wake parameters can include one or more virtual content fences (e.g., 428, 430, 444, 446, 464, 466) specifying pose parameters (e.g., one or more poses, one or more ranges of poses) and/or virtual content parameters (e.g., one or more locations, one or more location ranges, one or more orientations, one or more orientation ranges, one or more occlusions) for triggering the higher-power processing. For example, the wake parameters can be based on one or more virtual content fences configured to trigger the higher-power processing to be initiated or resumed if a pose of the computing system 100 matches or falls within location and/or orientation parameters in one or more virtual content fences, or alternatively if the pose of the computing system 100 does not match or fall within location and/or orientation parameters in the one or more virtual content fences.

In some examples, the one or more virtual content fences can be automatically harvested from a renderer (e.g., GPU 106) on the computing system 100. For example, the GPU 106 on the computing system 100 can know what content, if any, is being rendered or expects to be rendered. The GPU 106 can maintain an updated list of virtual content fences that take into account the location and state of any virtual content configured for rendering. The updated list of virtual content fences can thus be used to determine if virtual content is being rendered or likely to be rendered in the near future, which can be used to trigger the higher-power processing to be initiated or resumed to render such virtual content or in anticipation of such virtual content being rendered.

In other examples, the one or more virtual content fences can be obtained from one or more virtual content applications on the computing system 100. For example, each virtual content application on the computing system 100 can maintain an updated list of virtual content fences that take into account the location of any virtual content configured for rendering by the application. The updated list of virtual content fences can be used to determine if the computing system 100 is at or nearing a location and/or orientation from where virtual content is visible or should be rendered, which can trigger the higher-power processing to be initiated or resumed to render such virtual content or in anticipation of such virtual content being rendered.

In some implementations, the wake parameters can specify that escalation from the lower-power processing to the higher-power processing should be triggered when a configurable percentage of in-state features from the map data available to the lower-power processor 116 is untrackable from a location and/or orientation of the computing system 100. Such in-state features can become untrackable when, for example, the orientation and/or location of the computing system 100 changes a certain amount, the computing system 100 and such features become too far away to track, an obstruction/occlusion prevents such features from being tracked from the location and/or orientation of the computing system 100.

In some implementations, the wake parameters can specify that escalation from the lower-power processing to the higher-power processing should be triggered when a configurable movement velocity threshold is exceeded by the computing system 100, as determined based on the sensor data. Moreover, in some implementations, the wake parameters can specify that escalation from the lower-power processing to the higher-power processing should be triggered when a configurable amount of time has passed since the lower-power processing was triggered or performed (e.g., when the lower-power processing has been running for a configurable amount of time), when a configurable amount of time has passed since the higher-power processing was triggered or performed, and/or when a configurable amount of time has passed since the renderer (e.g., GPU 106) was used to render content. In some cases, the amount of time can be lower in dynamic environments where the feature map may need to be updated more frequently. For example, the amount of time can be lowered in a dynamic environment to trigger more frequent localization and/or mapping operations, even if the computing system 100 is not moving a lot or is farther away from any virtual content configured for rendering.

In some cases, the amount of time specified by the wake parameters for triggering the higher-power processing can vary based on battery or thermal conditions at the computing system 100. For example, when battery power levels at the computing system 100 are higher, the timer values can be decreased to trigger more frequent escalation to the higher-power processing, which can provide higher-fidelity tracking, localization and/or mapping updates. On the other hand, when battery power levels at the computing system 100 are lower, the timer values can be increased to trigger less frequent escalation to the higher-power processing in order to conserve more power.

By using timer values, the lower-power processor 116 can provide flexibility in the aggressiveness of the lower-power processing entry and exit. For example, the timer values can be adjusted to increase or decrease the amount of time or frequency of the lower-power processing and/or the higher-power processing. In some examples, entry into the higher-power processing can be biased to be more frequent during more forgiving thermal conditions and/or high battery scenarios, and less frequent during high thermal conditions and low battery scenarios.

In some implementations, the wake parameters can include specific time intervals at which higher-power processing can be initiated or resumed to perform relocalization. For example, in some cases, the lower-power processing can perform lower-fidelity tracking, which can be more susceptible to tracking errors and inaccuracies resulting from, for example, drift, frequent movements, faster motion. To correct, prevent, and/or reduce such tracking errors and inaccuracies, the wake parameters can specify certain time intervals that trigger higher-power processing to perform relocalization. Once relocalization is complete, the lower-power processing can be resumed for power savings, unless another wake parameter for triggering higher-power processing is detected, in which case the higher-power processing can continue until the lower-power processor 116 determines (e.g., via the lower-power initiator 202) that lower-power processing should be initiated.

FIG. 7 illustrates an example method 700 for implementing lower-power processing and higher-power processing. At step 702, the method 700 can include tracking, in a lower-power processing mode (e.g., 540) using a set of lower-power circuit elements on an integrated circuit (e.g., SoC 102), a position and orientation of a computing device (e.g., 100) during a lower-power processing period. In some examples, the set of lower-power circuit elements can include on-chip memory 114, lower-power processor 116, and control system elements 118. In some cases, the on-chip memory 114 can be, for example, on-chip SRAM.

The tracking can include a lower-power tracking or VIO performed by the lower-power circuit elements on the integrated circuit. For example, the tracking can be performed as part of the lower-power processing 204, as previously described. Moreover, during the lower-power processing mode and the lower-power processing period, the integrated circuit can have other components powered off to save power. For example, one or more higher-power circuit elements (e.g., 104-112) can be powered off during the lower-power processing mode to reduce power usage and idle power from the one or more higher-power circuit elements.

The method 700 can include suspending, at step 704, the tracking in the lower-power processing mode based on a triggering event, and initiating, at step 706, a higher-power processing mode (e.g., 510) for tracking the position and orientation of the computing device during a higher-power processing period.

In some examples, the triggering event can include a determination that in-state features in a feature map corresponding to a scene associated with the computing device are untrackable by the set of lower-power circuit elements from a current position and orientation of the computing device, a determination that an amount or speed of rotational and translational motion of the computing device exceeds a threshold, and/or a determination that a threshold amount of time has passed since the lower-power processing period and the lower-power processing mode were initiated.

In other examples, the triggering event can include a determination that the computing device has breached a virtual content fence (428, 430, 456, 458, 476, 478) defining one or more computing device positions and one or more computing device orientations set to trigger the higher-power processing mode when the computing device is determined to be within the one or more computing device positions. In yet other examples, the triggering event can include a determination that one or more virtual content objects are outside of a visible range from a position and orientation of the computing device. In some cases, the determination that the one or more virtual content objects are outside of the visible range can be based on a respective location of the one or more virtual content objects and/or one or more virtual content occlusion locations.

At step 708, the method 700 can include tracking, in the higher-power processing mode using a set of higher-power circuit elements (e.g., 104-112) on the integrated circuit and an off-chip memory (e.g., 132), the position and orientation of the computing device during the higher-power processing period. The off-chip memory can include, for example, off-chip DRAM.

The tracking in the higher-power processing mode can include a higher-power or higher-fidelity tracking or VIO performed by the set of higher-power circuit elements on the integrated circuit and the off-chip memory. For example, the tracking in the higher-power processing mode can include the higher-power processing 220, as previously described. Moreover, during the higher-power processing mode, the method 700 can use the set of higher-power circuit elements to perform localization, mapping, rendering, and any other operations.

In some examples, the tracking in the lower-power processing mode can be based on sensor data received by the set of lower-power circuit elements from one or more image sensors (e.g., 130A) and one or more inertial sensors (e.g., 130B), and the tracking in the higher-power processing mode can be based on sensor data received by the set of higher-power circuit elements from the same one or more image sensors and one or more inertial sensors and/or one or more different sensors (e.g., one or more different image and inertial sensors).

The set of higher-power circuit elements can include one or more processors, such as one or more CPUs, GPUs, DSPs, ISPs. Moreover, the set of lower-power circuit elements can include one or more processors having a lower-power requirement than the one or more processors in the set of higher-power circuit elements. In some cases, the set of higher-power circuit elements can also include one or more control system elements (e.g., 112), such as one or more PPL clock generators, and the set of lower-power circuit elements can also include a ring oscillator clock generator.

In some cases, the method 700 can include generating, by the set of higher-power circuit elements, a feature map corresponding to a scene (e.g., 512) associated with the computing device, anchoring, by the set of higher-power circuit elements during the higher-power processing period, virtual content to one or more features in the feature map, and rendering, by the set of higher-power circuit elements during the higher-power processing period, the virtual content on a display location corresponding to the one or more features in the feature map. In some examples, the virtual content can include, without limitation, a virtual image, a virtual video, digital content, a virtual game, interactive virtual content, a virtual content overlay, a virtual scene, a virtual simulation, a virtual object, a virtual web page, etc.

The feature map can be generated by the set of higher-power circuit elements during the higher-power processing period and while operating in the higher-power processing mode. In some examples, the feature map can include map points representing features in a 3D location within the scene. Moreover, in some cases, the set of higher-power circuit elements can provide the feature map (or a portion thereof) to the set of lower-power circuit elements. The set of lower-power circuit elements can use the feature map to track mapped features. In some cases, tracking the position and orientation of the computing device can include tracking a pose of the computing device relative to one or more features in the feature map.

In some cases, the method 700 can include detecting, by the set of higher-power circuit elements during the higher-power processing period, one or more lower-power processing triggering conditions, suspending, based on the one or more lower-power processing triggering conditions, the tracking in the higher-power processing mode, initiating the lower-power processing mode for tracking the position and orientation of the computing device during a second lower-power processing period, and tracking, in the lower-power processing mode using the set of lower-power circuit elements on the integrated circuit, the position and orientation of the computing device during the second lower-power processing period.

In some examples, the one or more lower-power processing triggering conditions can include a determination that the computing device is located within a pre-mapped area, a determination that a rotational and translational motion of the computing device is below a threshold, a determination that the computing device is outside a visible range associated with one or more virtual content items, etc.

In some examples, the lower-power circuit elements can provide lower-power processing by virtue of design, and can utilize lower camera resolution/framerate, fewer visual features, and/or a smaller visual feature map during lower-power processing periods as described herein. In some cases, the lower-power processing described herein can use a subset of in-state/out-of-state map features from the higher-power processing in order to fit the features in an on-chip SRAM (e.g., 114) rather than DRAM memory, which can have higher power requirements.

In some examples, the lower-power processing and higher-power processing technologies herein can achieve significant performance improvements. For example, in some cases, a computing device can utilize ~500 milliwatts (mW) for higher-power VIO, ~15 mW for lower-power auxiliary VIO (or simply inertial odometry), ~1 watts (W) for relocalization, ~200 mW during wake/sleep operations for ~50 milliseconds (ms) in each direction. In some examples, power usage for relocalization via higher-power processing can include 333 ms of lower-power processing plus 50 ms for a wake event, plus 100 ms for relocalization, plus 50 ms of sleep for a total of ~235 mW average power, which is less than a power usage of ~500 mW in a higher-power processing only implementation.

In some examples, the flowchart 600 and the method 700 may be performed by one or more computing devices or apparatuses. In one illustrative example, the flowchart 600 and the method 700 can be performed by the computing system 100 shown in FIG. 1 and/or one or more computing devices with the computing device architecture 800 shown in FIG. 8. In some cases, such a computing device or apparatus may include a processor, microprocessor, microcomputer, or other component of a device that is configured to carry out the steps of the flowchart 600 and the method 700. In some examples, such computing device or apparatus may include one or more sensors configured to collect sensor measurements. For example, the computing device can include a head-mounted display, a mobile device, or other suitable device. In some examples, such computing device or apparatus may include a camera configured to capture one or more images or videos. In some cases, such computing device may include a display for displaying images. In some examples, the one or more sensors and/or camera are separate from the computing device, in which case the computing device receives the sensor measurements. Such computing device may further include a network interface configured to communicate data.

The flowchart 600 and the method 700 are illustrated as logical flow diagrams, the operations of which represent a sequence of operations that can be implemented in hardware, computer instructions, or a combination thereof. In the context of computer instructions, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular data types. The order in which the operations are described is not intended to be construed as a limitation, and any number of the described operations can be combined in any order and/or in parallel to implement the processes.

Additionally, the flowchart 600 and the method 700 may be performed under the control of one or more computer systems configured with executable instructions and may be implemented as code (e.g., executable instructions, one or more computer programs, or one or more applications) executing collectively on one or more processors, by hardware, or combinations thereof. As noted above, the code may be stored on a computer-readable or machine-readable storage medium, for example, in the form of a computer program comprising a plurality of instructions executable by one or more processors. The computer-readable or machine-readable storage medium may be non-transitory.

FIG. 8 illustrates an example computing device architecture 800 of an example computing device which can implement various techniques described herein. For example, the computing device architecture 800 can implement at least some portions of the computing system 100 shown in FIG. 1, and perform tracking, localization, mapping, and rendering operations as described herein. The components of the computing device architecture 800 are shown in electrical communication with each other using a connection 805, such as a bus. The example computing device architecture 800 includes a processing unit (CPU or processor) 810 and a computing device connection 805 that couples various computing device components including the computing device memory 815, such as read only memory (ROM) 820 and random access memory (RAM) 825, to the processor 810.

The computing device architecture 800 can include a cache of high-speed memory connected directly with, in close proximity to, or integrated as part of the processor 810. The computing device architecture 800 can copy data from the memory 815 and/or the storage device 830 to the cache 812 for quick access by the processor 810. In this way, the cache can provide a performance boost that avoids processor 810 delays while waiting for data. These and other modules can control or be configured to control the processor 810 to perform various actions. Other computing device memory 815 may be available for use as well. The memory 815 can include multiple different types of memory with different performance characteristics. The processor 810 can include any general purpose processor and a hardware or software service, such as service 1 832, service 2 834, and service 3 836 stored in storage device 830, configured to control the processor 810 as well as a special-purpose processor where software instructions are incorporated into the processor design. The processor 810 may be a self-contained system, containing multiple cores or processors, a bus, memory controller, cache, etc. A multi-core processor may be symmetric or asymmetric.

To enable user interaction with the computing device architecture 800, an input device 845 can represent any number of input mechanisms, such as a microphone for speech, a touch-sensitive screen for gesture or graphical input, keyboard, mouse, motion input, speech and so forth. An output device 835 can also be one or more of a number of output mechanisms known to those of skill in the art, such as a display, projector, television, speaker device. In some instances, multimodal computing devices can enable a user to provide multiple types of input to communicate with the computing device architecture 800. The communication interface 840 can generally govern and manage the user input and computing device output. There is no restriction on operating on any particular hardware arrangement and therefore the basic features here may easily be substituted for improved hardware or firmware arrangements as they are developed.

Storage device 830 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 825, read only memory (ROM) 820, and hybrids thereof. The storage device 830 can include services 832, 834, 836 for controlling the processor 810. Other hardware or software modules are contemplated. The storage device 830 can be connected to the computing device connection 805. In one aspect, a hardware module that performs a particular function can include the software component stored in a computer-readable medium in connection with the necessary hardware components, such as the processor 810, connection 805, output device 835, and so forth, to carry out the function.

The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data can be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-readable medium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, or the like.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Specific details are provided in the description above to provide a thorough understanding of the embodiments and examples provided herein. However, it will be understood by one of ordinary skill in the art that the embodiments may be practiced without these specific details. For clarity of explanation, in some instances the present technology may be presented as including individual functional blocks comprising devices, device components, steps or routines in a method embodied in software, or combinations of hardware and software. Additional components may be used other than those shown in the figures and/or described herein. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Individual embodiments may be described above as a process or method which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

Processes and methods according to the above-described examples can be implemented using computer-executable instructions that are stored or otherwise available from computer-readable media. Such instructions can include, for example, instructions and data which cause or otherwise configure a general purpose computer, special purpose computer, or a processing device to perform a certain function or group of functions. Portions of computer resources used can be accessible over a network. The computer executable instructions may be, for example, binaries, intermediate format instructions such as assembly language, firmware, source code. Examples of computer-readable media that may be used to store instructions, information used, and/or information created during methods according to described examples include magnetic or optical disks, flash memory, USB devices provided with non-volatile memory, networked storage devices, and so on.

Devices implementing processes and methods according to these disclosures can include hardware, software, firmware, middleware, microcode, hardware description languages, or any combination thereof, and can take any of a variety of form factors. When implemented in software, firmware, middleware, or microcode, the program code or code segments to perform the necessary tasks (e.g., a computer-program product) may be stored in a computer-readable or machine-readable medium. A processor(s) may perform the necessary tasks. Typical examples of form factors include laptops, smart phones, mobile phones, tablet devices or other small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are example means for providing the functions described in the disclosure.

In the foregoing description, aspects of the application are described with reference to specific embodiments thereof, but those skilled in the art will recognize that the application is not limited thereto. Thus, while illustrative embodiments of the application have been described in detail herein, it is to be understood that the inventive concepts may be otherwise variously embodied and employed, and that the appended claims are intended to be construed to include such variations, except as limited by the prior art. Various features and aspects of the above-described application may be used individually or jointly. Further, embodiments can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate embodiments, the methods may be performed in a different order than that described.

One of ordinary skill will appreciate that the less than ("<") and greater than (">") symbols or terminology used herein can be replaced with less than or equal to ("≤") and greater than or equal to ("≥") symbols, respectively, without departing from the scope of this description.

Where components are described as being "configured to" perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

The phrase "coupled to" refers to any component that is physically connected to another component either directly or indirectly, and/or any component that is in communication with another component (e.g., connected to the other component over a wired or wireless connection, and/or other suitable communication interface) either directly or indirectly.

Claim language or other language reciting "at least one of" a set or "one or more of" a set" indicates that one member of the set or multiple members of the set (in any combination) satisfy the claim. For example, claim language reciting "at least one of A and B" means A, B, or A and B. In another example, claim language reciting "one or more of A and B" means A, B, or A and B. In another example, claim language reciting "one or more of A, B, and C" means A, B, C, A and B, A and C, B and C, or all of A, B, and C.

The various illustrative logical blocks, modules, circuits, and algorithm steps described in connection with the examples disclosed herein may be implemented as electronic hardware, computer software, firmware, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present application.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the methods, algorithms, and/or operations described above. The computer-readable data storage medium may form part of a computer program product, which may include packaging materials. The computer-readable medium may comprise memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

The program code may be executed by a processor, which may include one or more processors, such as one or more digital signal processors (DSPs), general purpose microprocessors, an application specific integrated circuits (ASICs), field programmable logic arrays (FPGAs), or other equivalent integrated or discrete logic circuitry. Such a processor may be configured to perform any of the techniques described in this disclosure. A general purpose processor may be a microprocessor; but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Accordingly, the term "processor," as used herein may refer to any of the foregoing structure, any combination of the foregoing structure, or any other structure or apparatus suitable for implementation of the techniques described herein.

Statements of the disclosure include:

Statement 1: A method comprising tracking, in a lower-power processing mode using a set of lower-power circuit elements on an integrated circuit, a position and orientation of a computing device during a lower-power processing period; initiating a higher-power processing mode for tracking the position and orientation of the computing device during a higher-power processing period; and tracking, in the higher-power processing mode using a set of higher-power circuit elements on the integrated circuit, the position and orientation of the computing device during the higher-power processing period, wherein the set of higher-power circuit elements track the position and orientation of the computing device using an element that is not included in the set of lower-power circuit elements or used by the set of lower-power circuit elements during the lower-power processing mode.

Statement 2: A method according to Statement 1, wherein the set of higher-power circuit elements comprises a first processor and the set of lower-power circuit elements comprises a second processor having a lower-power requirement than the first processor.

Statement 3: A method according to Statement 2, wherein the first processor comprises a central processing unit (CPU) and the second processor comprises a digital signal processor (DSP).

Statement 4: A method according to any of Statements 1 through 3, wherein at least a portion of the set of higher-power circuit elements is powered off during the lower-power processing period.

Statement 5: A method according to any of Statements 1 through 4, wherein the integrated circuit comprises a system-on-chip, wherein the element comprises a dynamic random access memory (DRAM).

Statement 6: A method according to statement 5, wherein the DRAM comprises an off-chip DRAM, wherein the set of lower-power circuit elements comprises a static random access memory (SRAM), and wherein the set of lower-power circuit elements comprise a lower-power processing region that is separate from the set of higher-power circuit elements.

Statement 7: A method according to any of Statements 1 through 6, wherein the set of higher-power circuit elements comprises at least one of a central processing unit (CPU), a graphics processing unit (GPU), a digital signal processor (DSP), an image signal processor (ISP), and a phase-locked loop (PLL) clock generator, and wherein the set of lower-power circuit elements comprises at least one of a ring oscillator clock generator and a processor core.

Statement 8: A method according to any of Statements 1 through 7, wherein the tracking in the lower-power processing mode is based on sensor data received by the set of lower-power circuit elements from one or more inertial sensors and one or more image sensors, and wherein the tracking in the higher-power processing mode is based on sensor data received by the set of higher-power circuit elements from the one or more inertial sensors and the one or more image sensors.

Statement 9: A method according to any of Statements 1 through 7, wherein the tracking in the lower-power processing mode is based on sensor data received by the set of lower-power circuit elements from one or more inertial sensors, and wherein the tracking in the higher-power processing mode is based on sensor data received by the set of higher-power circuit elements from the one or more inertial sensors and one or more image sensors.

Statement 10: A method according to any of Statements 1 through 9, further comprising: generating, by the set of higher-power circuit elements, a feature map corresponding to a scene associated with the computing device, the feature map being generated by the set of higher-power circuit elements during the higher-power processing period and while operating in the higher-power processing mode, wherein the feature map comprises a plurality of map points representing features at a three-dimensional location within the scene; and rendering, by the set of higher-power circuit elements during the higher-power processing period, virtual content on a display location corresponding to one or more features in the feature map, the virtual content being anchored to the one or more features in the feature map.

Statement 11: A method according to Statement 10, further comprising: detecting that a content renderer associated with the set of higher-power circuit elements has not rendered the virtual content or additional virtual content for an amount of time; in response to detecting that the content renderer has not rendered the virtual content or additional virtual content for the amount of time, suspending the tracking in the higher-power processing mode; initiating the lower-power processing mode for tracking the position and orientation of the computing device during a second lower-power processing period; an tracking, in the lower-power processing mode using the set of lower-power circuit elements on the integrated circuit, the position and orientation of the computing device during the second lower-power processing period.

Statement 12: A method according to Statement 10, further comprising: receiving, from one or more applications on the computing device, an indication that the one or more applications do not expect additional virtual content to be rendered for at least a period of time; suspending, based on the indication that the one or more applications do not expect additional virtual content to be rendered for at least the period of time, the tracking in the higher-power processing mode initiating the lower-power processing mode for tracking the position and orientation of the computing device during a second lower-power processing period; and tracking, in the lower-power processing mode using the set of lower-power circuit elements on the integrated circuit, the position and orientation of the computing device during the second lower-power processing period.

Statement 13: A method according to Statement 10, further comprising providing the feature map to the set of lower-power circuit elements.

Statement 14: A method according to Statement 13, wherein tracking the position and orientation of the computing device comprises tracking a pose of the computing device relative to one or more features in the feature map, and wherein the virtual content comprises at least one of a virtual image, a virtual video, digital content, one or more virtual games, interactive virtual content, a virtual content overlay, a virtual scene, a virtual simulation, a virtual object, and a virtual web page.

Statement 15: A method according to any of Statements 1 through 14, further comprising: detecting, by the set of higher-power circuit elements during the higher-power processing period, one or more lower-power processing triggering conditions; suspending, based on the one or more lower-power processing triggering conditions, the tracking in the higher-power processing mode; initiating the lower-power processing mode for tracking the position and orientation of the computing device during a second lower-power processing period; and tracking, in the lower-power processing mode using the set of lower-power circuit elements on the integrated circuit, the position and orientation of the computing device during the second lower-power processing period.

Statement 16: A method according to Statement 15, wherein the one or more lower-power processing triggering conditions comprise at least one of a determination that the computing device is located within a pre-mapped area, a determination that a rotational and translational motion of the computing device is below a threshold, and a determination that the computing device is outside a visible range associated with one or more virtual content items.

Statement 17: A method according to any of Statements 1 through 16, further comprising suspending, based on a triggering event, the tracking in the lower-power processing mode, wherein the triggering event comprises at least one of a determination that in-state features in a feature map corresponding to a scene associated with the computing device are untrackable by the set of lower-power circuit elements from a current position and orientation of the computing device, a determination that an amount or speed of rotational and translational motion of the computing device exceeds a threshold, and a determination that a threshold amount of time has passed since the lower-power processing period and the lower-power processing mode were initiated.

Statement 18: A method according to any of Statements 1 through 17, further comprising suspending, based on a triggering event, the tracking in the lower-power processing mode, wherein the triggering event comprises a determination that the computing device has breached a virtual content fence defining one or more computing device positions and a range of computing device orientations set to trigger the higher-power processing mode when the computing device is determined to be within the one or more computing device positions.

Statement 19: A method according to any of Statements 1 through 18, further comprising suspending, based on a triggering event, the tracking in the lower-power processing mode, wherein the triggering event comprises a determination that one or more virtual content objects are outside of a visible range from a current position and orientation of the computing device, wherein the determination that the one or more virtual content objects are outside of the visible range is based on one or more respective locations of the one or more virtual content objects and a set of virtual content occlusion locations.

Statement 20: An apparatus comprising an integrated circuit comprising a set of lower-power circuit elements configured to track, in a lower-power processing mode, a position and orientation of the apparatus during a lower-power processing period; and initiate a higher-power processing mode for tracking the position and orientation of the apparatus during a higher-power processing period; and a set of higher-power circuit elements configured to track, in the higher-power processing mode, the position and orientation of the apparatus during the higher-power processing period, wherein the set of higher-power circuit elements track the position and orientation of the computing device using an element that is not included in the set of lower-power circuit elements or used by the set of lower-power circuit elements during the lower-power processing mode.

Statement 21: An apparatus according to Statement 20, wherein the set of higher-power circuit elements comprises a first processor and the set of lower-power circuit elements comprises a second processor having a lower-power requirement than the first processor.

Statement 22: An apparatus according to Statement 21, wherein the first processor comprises a central processing unit (CPU) and the second processor comprises a digital signal processor (DSP).

Statement 23: An apparatus according to any of Statements 20 through 22, wherein at least a portion of the set of higher-power circuit elements is powered off during the lower-power processing period.

Statement 24: An apparatus according to any of Statements 20 through 23, wherein the integrated circuit comprises a system-on-chip, wherein the element comprises a dynamic random access memory (DRAM).

Statement 25: An apparatus according to Statement 24, wherein the DRAM comprises an off-chip DRAM, wherein the set of lower-power circuit elements comprises a static random access memory (SRAM).

Statement 26: An apparatus according to any of Statements 20 through 25, wherein the set of higher-power circuit elements comprises at least one of a central processing unit (CPU), a graphics processing unit (GPU), a digital signal processor (DSP), an image signal processor (ISP), and a phase-locked loop (PLL) clock generator, and wherein the set of lower-power circuit elements comprises at least one of a ring oscillator clock generator and a processor core.

Statement 27: An apparatus according to any of Statements 20 through 26, wherein the tracking in the lower-power processing mode is based on sensor data received by the set of lower-power circuit elements from one or more inertial sensors and one or more image sensors, and wherein the tracking in the higher-power processing mode is based on sensor data received by the set of higher-power circuit elements from the one or more inertial sensors and the one or more image sensors.

Statement 28: An apparatus according to any of Statements 20 through 27, wherein the set of higher-power circuit elements is configured to: generate a feature map corresponding to a scene associated with the apparatus, the feature map being generated by the set of higher-power circuit elements during the higher-power processing period and while operating in the higher-power processing mode, wherein the feature map comprises a plurality of map points representing features at a three-dimensional location within the scene; and render, during the higher-power processing period, virtual content on a display location corresponding to one or more features in the feature map, the virtual content being anchored to the one or more features in the feature map.

Statement 29: An apparatus according to Statement 28, wherein the set of higher-power circuit elements is configured to provide the feature map to the set of lower-power circuit elements.

Statement 30: An apparatus according to Statement 28, wherein the set of lower-power circuit elements is configured to: detect that a content renderer associated with the set of higher-power circuit elements has not rendered the virtual content or additional virtual content for an amount of time; in response to detecting that the content renderer has not rendered the virtual content or additional virtual content for the amount of time, suspend the tracking in the higher-power processing mode; initiate the lower-power processing mode for tracking the position and orientation of the computing device during a second lower-power processing period; and track, in the lower-power processing mode, the position and orientation of the computing device during the second lower-power processing period.

Statement 31: An apparatus according to Statement 28, wherein the set of lower-power circuit elements is configured to: receive, from one or more applications on the computing device, an indication that the one or more applications do not expect additional virtual content to be rendered for at least a period of time; suspend, based on the indication that the one or more applications do not expect additional virtual content to be rendered for at least the period of time, the tracking in the higher-power processing mode; initiate the lower-power processing mode for tracking the position and orientation of the computing device during a second lower-power processing period; and track, in the lower-power processing mode, the position and orientation of the computing device during the second lower-power processing period.

Statement 32: An apparatus according to Statement 28, wherein tracking the position and orientation of the apparatus comprises tracking a pose of the apparatus relative to one or more features in the feature map, and wherein the virtual content comprises at least one of a virtual image, a virtual video, digital content, one or more virtual games, interactive virtual content, a virtual content overlay, a virtual scene, a virtual simulation, a virtual object, and a virtual web page.

Statement 33: An apparatus according to any of Statements 20 through 32, wherein the set of higher-power circuit elements is configured to: detect, during the higher-power processing period, one or more lower-power processing triggering conditions; suspend, based on the one or more lower-power processing triggering conditions, the tracking in the higher-power processing mode; and initiate the lower-power processing mode for tracking the position and orientation of the apparatus during a second lower-power processing period.

Statement 34: An apparatus according to Statement 33, wherein the set of lower-power circuit elements are configured to track, in the lower-power processing mode, the position and orientation of the apparatus during the second lower-power processing period, wherein the one or more lower-power processing triggering conditions comprise at least one of a determination that the apparatus is located within a pre-mapped area, a determination that a rotational and translational motion of the apparatus is below a threshold, and a determination that the apparatus is outside a visible range associated with one or more virtual content items.

Statement 35: An apparatus according to any of Statements 20 through 34, wherein the set of lower-power circuit elements is configured to suspend, based on a triggering event, the tracking in the lower-power processing mode, wherein the triggering event comprises at least one of a determination that in-state features in a feature map corresponding to a scene are untrackable by the set of lower-power circuit elements from a current position and orientation, a determination that an amount or speed of rotational and translational motion of the apparatus exceeds a threshold, a determination that a threshold amount of time has passed since the lower-power processing period and lower-power processing mode were initiated, and a determination that the apparatus has breached a virtual content fence defining a range of apparatus orientations set to trigger the higher-power processing mode when the apparatus is determined to be within one or more predefined apparatus positions.

Statement 36: An apparatus according to any of Statements 20 through 35, comprising a head-mounted device.

Statement 37: At least one non-transitory computer-readable medium comprising: a first set of instructions which, when executed by a set of lower-power circuit elements on an integrated circuit, cause the set of lower-power circuit elements to track, in a lower-power processing mode during a lower-power processing period, a position and orientation of a computing device; and initiate a higher-power processing mode for tracking the position and orientation of the computing device during a higher-power processing period; and a second set of instructions which, when executed by a set of higher-power circuit elements on the integrated circuit, cause the set of higher-power circuit elements to track, in the higher-power processing mode, the position and orientation of the computing device during the higher-power processing period, wherein the set of higher-power circuit elements track the position and orientation of the computing device using an element that is not included in the set of lower-power circuit elements or used by the set of lower-power circuit elements during the lower-power processing mode.

Statement 38: At least one non-transitory computer-readable medium according to Statement 30, further comprising instructions effective to perform a method according to any of Statements 1 through 19.

Statement 32: An apparatus comprising means for performing a method according to any of Statements 1 through 19.

What is claimed is:

1. An apparatus comprising:
    a memory; and
    one or more processors coupled to the memory, the one or more processors being configured to:
        track, in a first processing mode, a pose of the apparatus;
        in response to a trigger, initiate a second processing mode for performing one or more operations at the apparatus, the one or more operations comprising at least one of a tracking operation, a mapping operation, and a content rendering operation, wherein the apparatus consumes more power when implementing the second processing mode than the first processing mode; and
        perform the one or more operations.

2. The apparatus of claim 1, wherein, to perform the one or more operations, the processor is configured to perform the one or more operations while the apparatus is in the second processing mode.

3. The apparatus of claim 1, wherein the trigger comprises a determination that at least one of an amount of rotational and translational motion of the apparatus exceeds a threshold.

4. The apparatus of claim 1, wherein the trigger comprises a determination that one or more virtual content objects are outside of a view of one or more image sensors of the apparatus.

5. The apparatus of claim 4, wherein the determination that one or more virtual content objects are outside of the view of one or more image sensors of the apparatus is based on at least one of a current pose of the apparatus, one or more locations of the one or more virtual content objects, and a set of virtual content occlusion locations.

6. The apparatus of claim 1, wherein the trigger comprises a determination that a threshold amount of time has passed since the first processing mode was initiated.

7. The apparatus of claim 1, wherein the trigger comprises a determination that the apparatus has breached a virtual content fence defining a range of apparatus orientations set to trigger the second processing mode when the apparatus is determined to be within one or more predefined apparatus positions.

8. The apparatus of claim 1, further comprising a first set of circuit elements and a second set of circuit elements, wherein the first set of circuit elements are associated with a lower power consumption than the second set of circuit elements, wherein the first processing mode is implemented using the first set of circuit elements and the first processing mode is implemented using the second set of circuit elements.

9. The apparatus of claim 8, wherein the trigger comprises a determination that in-state features in a feature map corresponding to a scene are untrackable by the first set of circuit elements from a current pose of the apparatus.

10. The apparatus of claim 8, wherein the second set of circuit elements is configured to:
generate a feature map corresponding to a scene associated with the apparatus, the feature map being generated by the second set of circuit elements during the second processing mode, wherein the feature map comprises a plurality of map points representing features at a three-dimensional location within the scene; and
render, during the second processing mode, virtual content on a display location corresponding to one or more features in the feature map, the virtual content being anchored to the one or more features in the feature map.

11. The apparatus of claim 10, wherein the first set of circuit elements is configured to:
detect that the second set of circuit elements has not rendered the virtual content or additional virtual content for an amount of time;
in response to detecting that the second set of circuit elements has not rendered the virtual content or additional virtual content for the amount of time, initiate the first processing mode for tracking the pose of the apparatus; and
track, in the first processing mode, the pose of the apparatus.

12. The apparatus of claim 11, wherein the one or more processors are configured to:
prior to initiating the first processing mode in response to detecting that the second set of circuit elements has not rendered the virtual content or additional virtual content for the amount of time, suspend the one or more operations in the second processing mode.

13. The apparatus of claim 1, wherein the one or more processors are configured to:
receive, from one or more applications on the apparatus, an indication that the one or more applications will not render virtual content for at least a period of time;
based on the indication, suspend a tracking operation in the second processing mode;
initiate the first processing mode for tracking the pose of the apparatus; and
track, in the first processing mode, the pose position and orientation of the apparatus.

14. The apparatus of claim 1, wherein the one or more processors are configured to:
detect, during the second processing mode, a second trigger configured to trigger a switch from the second processing mode to the first processing mode;
suspend, based on the second trigger, a tracking operation in the second processing mode; and
initiate the first processing mode for tracking the pose of the apparatus.

15. The apparatus of claim 1, wherein, to initiate the second processing mode for performing one or more operations, the one or more processors are configured to suspend the first processing mode.

16. The apparatus of claim 1, wherein the one or more operations comprise one or more extended reality (XR) operations associated with an XR application on the apparatus.

17. The apparatus of claim 1, wherein the apparatus comprises a mobile device.

18. The apparatus of claim 15, wherein the mobile device comprises a head-mounted display.

19. The apparatus of claim 1, wherein the trigger comprises a user action.

20. The apparatus of claim 19, wherein the user action comprises at least one of a change in a head pose of a user associated with the apparatus and moving from a first location to a second location.

21. A method comprising:
tracking, in a first processing mode, a pose of a computing device;
in response to a trigger, initiating a second processing mode for performing one or more operations at the computing device, the one or more operations comprising at least one of a tracking operation, a mapping operation, and a content rendering operation, wherein the computing device consumes more power when implementing the second processing mode than the first processing mode; and
performing the one or more operations.

22. The method of claim 21, wherein performing the one or more operations comprises performing the one or more operations while the computing device is in the second processing mode.

23. The method of claim 21, wherein the trigger comprises at least one of a user action and a determination that at least one of an amount of rotational and translational motion of the computing device exceeds a threshold.

24. The method of claim 21, wherein the trigger comprises a determination that one or more virtual content objects are outside of a view of one or more image sensors of the computing device, and wherein the determination that one or more virtual content objects are outside of the view of one or more image sensors of the computing device is based on at least one of a current pose of the computing device, one or more locations of the one or more virtual content objects, and a set of virtual content occlusion locations.

25. The method of claim 21, wherein the trigger comprises at least one of a determination that a threshold amount of time has passed since the first processing mode was initiated and a determination that in-state features in a feature map corresponding to a scene are untrackable by the first set of circuit elements from a current pose of the computing device.

26. The method of claim 21, wherein the trigger comprises a determination that the computing device has breached a virtual content fence defining a range of computing device orientations set to trigger the second processing mode when the computing device is determined to be within one or more predefined computing device positions.

27. The method of claim 21, wherein the first processing mode is implemented using a first set of circuit elements of the computing device and the first processing mode is implemented using a second set of circuit elements of the computing device, and wherein the first set of circuit elements are associated with a lower power consumption than the second set of circuit elements.

28. The method of claim 27, further comprising:
generating a feature map corresponding to a scene associated with the computing device, the feature map being generated using the second set of circuit elements during the second processing mode, wherein the feature map comprises a plurality of map points representing features at a three-dimensional location within the scene; and rendering, during the second processing mode using the second set of circuit elements, virtual content on a display location corresponding to one or more features in the feature map, the virtual content being anchored to the one or more features in the feature map.

29. The method of claim 28, further comprising:
detecting, using the first set of circuit elements, that the second set of circuit elements has not rendered the virtual content or additional virtual content for an amount of time;
in response to detecting that the second set of circuit elements has not rendered the virtual content or additional virtual content for the amount of time, initiating the first processing mode for tracking the pose of the computing device; and
tracking, in the first processing mode using the first set of circuit elements, the pose of the computing device.

30. The method of claim 21, further comprising:
receiving, from one or more applications on the computing device, an indication that the one or more applications will not render virtual content for at least a period of time;
based on the indication, suspending a tracking operation in the second processing mode;
initiating the first processing mode for tracking the pose of the computing device; and
tracking, in the first processing mode, the pose of the computing device.

* * * * *